US009645622B2

(12) United States Patent
Ogawa et al.

(10) Patent No.: US 9,645,622 B2
(45) Date of Patent: May 9, 2017

(54) TEMPERATURE MANAGEMENT SYSTEM

(71) Applicant: FUJITSU LIMITED, Kawasaki-shi, Kanagawa (JP)

(72) Inventors: Masatoshi Ogawa, Isehara (JP); Hiroshi Endo, Isehara (JP); Hiroyuki Fukuda, Yokohama (JP); Masao Kondo, Sagamihara (JP)

(73) Assignee: FUJITSU LIMITED, Kawasaki (JP)

( * ) Notice: Subject to any disclaimer, the term of this patent is extended or adjusted under 35 U.S.C. 154(b) by 333 days.

(21) Appl. No.: 14/617,084

(22) Filed: Feb. 9, 2015

(65) Prior Publication Data
US 2015/0156917 A1 Jun. 4, 2015

Related U.S. Application Data

(63) Continuation of application No. PCT/JP2012/072417, filed on Sep. 4, 2012.

(51) Int. Cl.
*G06F 1/20* (2006.01)
*H05K 7/20* (2006.01)
(Continued)

(52) U.S. Cl.
CPC .............. *G06F 1/206* (2013.01); *G01K 13/02* (2013.01); *G06F 11/3051* (2013.01);
(Continued)

(58) Field of Classification Search
CPC .......... G06F 1/20; G06F 1/206; G06F 1/3203; G06F 1/3206; G06F 1/3209;
(Continued)

(56) References Cited

U.S. PATENT DOCUMENTS 4,999,557 A    3/1991   Inoue
6,006,168 A *  12/1999  Schumann ............. G01K 17/00
                                                    374/134
(Continued)

FOREIGN PATENT DOCUMENTS

CN    201210278 Y  *  3/2009
CN    101751053 A  *  6/2010  ......... G05D 23/1913
(Continued)

OTHER PUBLICATIONS

The expanded European Search Report mailed on Aug. 2, 2016 for corresponding to European Patent Application No. 12884059.2.
(Continued)

*Primary Examiner* — Crystal J Barnes-Bullock
(74) *Attorney, Agent, or Firm* — Kratz, Quintos & Hanson, LLP

(57) ABSTRACT

A temperature management system includes: temperature detection units which individually detect temperatures of a plurality of electronic devices each changing an amount of heat generation depending on its operational state; a cooling device which cools the electronic devices; and a control unit which controls the cooling device depending on outputs from the temperature detection units. The control unit includes: an idle state determination unit which determines whether or not the electronic devices are in an idle state; a manipulated variable calculation unit which has an integrator and calculates a manipulated variable by using a difference between a target value and a controlled variable; and an accumulation value correction unit which corrects an accumulation value of the integrator with a predetermined value when the idle state determination unit determines that the electronic devices are in the idle state.

14 Claims, 20 Drawing Sheets

(51) Int. Cl.
*G06F 11/30* (2006.01)
*G01K 13/02* (2006.01)

(52) U.S. Cl.
CPC ......... *H05K 7/207* (2013.01); *H05K 7/20136* (2013.01); *H05K 7/20836* (2013.01); *Y02B 60/1275* (2013.01)

(58) Field of Classification Search
CPC . G06F 11/3051; G05B 15/02; H05K 7/20136; H05K 7/20209; H05K 7/207; H05K 7/20818; H05K 7/20836; Y02B 60/1275; G01K 17/00; G05D 23/1917; G05D 23/1919
See application file for complete search history.

(56) References Cited

U.S. PATENT DOCUMENTS

| | | | |
|---|---|---|---|
| 6,553,271 | B1 | 4/2003 | Morrell |
| 8,224,489 | B2 | 7/2012 | Federspiel |
| 8,899,060 | B2 * | 12/2014 | Hall ................ G05D 23/1919 361/689 |
| 8,904,755 | B2 * | 12/2014 | Takeda ............... F02D 41/1494 60/276 |
| 2002/0138159 | A1 * | 9/2002 | Atkinson ............... G06F 1/206 700/21 |
| 2004/0020226 | A1 | 2/2004 | Bash et al. |
| 2004/0210328 | A1 | 10/2004 | Morrell |
| 2005/0011208 | A1 * | 1/2005 | Dobbs ................... F24F 11/053 62/178 |
| 2007/0101173 | A1 * | 5/2007 | Fung .................... G06F 1/3209 713/300 |
| 2007/0198109 | A1 | 8/2007 | Morrell |
| 2008/0066889 | A1 * | 3/2008 | Knight ............... F28D 15/0266 165/104.21 |
| 2014/0277807 | A1 * | 9/2014 | Mick .................. G05D 23/1917 700/295 |
| 2016/0116922 | A1 * | 4/2016 | Spink ..................... G05B 15/02 700/300 |

FOREIGN PATENT DOCUMENTS

| | | | |
|---|---|---|---|
| CN | 101751108 A | 6/2010 | |
| EP | 1416140 A1 | 5/2004 | |
| JP | S61-121110 | 6/1986 | |
| JP | S63-14047 | 1/1988 | |
| JP | H01-279304 | 11/1989 | |
| JP | H02-254501 | 10/1990 | |
| JP | H04-90216 | 8/1992 | |
| JP | 08146814 A * | 6/1996 | |
| JP | H11-327603 | 11/1999 | |
| JP | 2001-290504 A1 | 10/2001 | |
| JP | 2002-44882 A1 | 2/2002 | |
| JP | 2004-208388 A1 | 7/2004 | |
| JP | 2006-509294 A1 | 3/2006 | |
| JP | 2007-239462 A1 | 9/2007 | |
| JP | 2008-227127 A1 | 9/2008 | |
| JP | 2011-222029 A1 | 11/2011 | |
| JP | WO 2014037988 A1 * | 3/2014 | ......... H05K 7/20836 |
| JP | EP 2894524 A1 * | 7/2015 | ......... H05K 7/20836 |
| JP | 5975105 B2 * | 8/2016 | ......... H05K 7/20836 |
| WO | WO 00/73101 A1 | 12/2000 | |

OTHER PUBLICATIONS

R R Rhinehart et al., "Control Modes-PID Variations," In: "Process Control and Optimization", CRC Press, Jul. 19, 2005, XP055289812, vol. 2. Cited in the The EESR mailed on Aug. 2, 2016 for corresponding to European Patent Application No. 12884059.2.
Office Action of corresponding Chinese Patent Application No. 201280075578.2 dated May 11, 2016, with full translation.
K. Astrom, et al.; "PID controllers: theory, design and tuning;" ISA Press, Research Triangle Park, North Carolina; 1995; pp. 80-92 and cover sheet (8 Sheets total)/p. 2 of specification.
International Search Report for International Application No. PCT/JP2012/072417 dated Oct. 2, 2012.
Chinese Application No. 201280075578.2: Notification of the Second Office Action mailed Jan. 12, 2017.

* cited by examiner

FIG. 6

| DATA CODE | INTAKE AIR TEMPERATURE Tc | REFERENCE TEMPERATURE IN IDLE STATE Ta |
|---|---|---|
| 0 | $Tc_0$ | $Ta_0$ |
| 1 | $Tc_1$ | $Ta_1$ |
| ⋮ | ⋮ | ⋮ |
| i | $Tc_i$ | $Ta_i$ |
| ⋮ | ⋮ | ⋮ |
| N−1 | $Tc_{N-1}$ | $Ta_{N-1}$ |
| N | $Tc_N$ | $Ta_N$ |

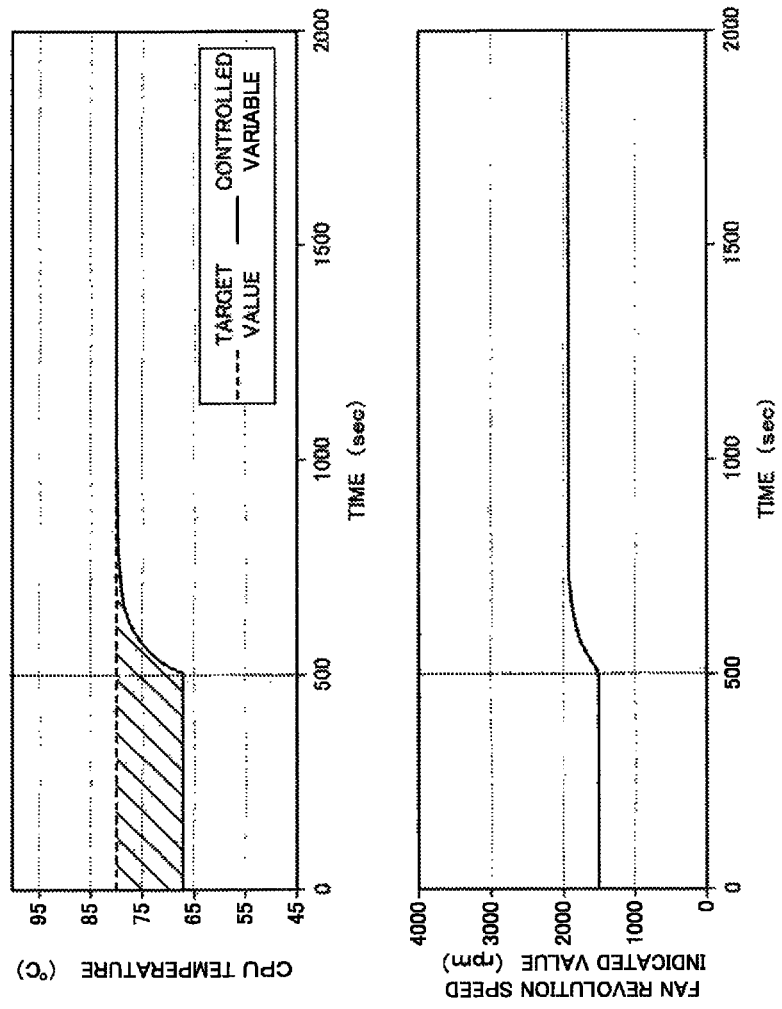

TEMPERATURE MANAGEMENT SYSTEM

CROSS-REFERENCE TO RELATED APPLICATION

This application is a continuation of International Patent Application No. PCT/JP2012/072417 filed Sep. 4, 2012 and designated the U.S., the entire contents of which are incorporated herein by reference.

FIELD

The embodiments discussed herein relate to a temperature management system.

BACKGROUND

With the recent advent of an advanced information society, an amount of data treated by computers has been increasing, and there has been a growing trend of collective management of many computers disposed in the same room in a facility such as a data center. For example, in such a data center, many racks (server racks) are disposed in a computer room and a plurality of computers (servers) are housed in each of the racks. Moreover, a large volume of jobs are efficiently processed by being organically distributed to the computers depending on operational states of the computers.

Meanwhile, each computer generates a large amount of heat during operation. A rise in temperature inside the computer may cause a malfunction or a failure. Accordingly, cooling air is taken into each rack by using a cooling fan, and the heat generated inside the computer is discharged to the outside of the rack.

In the meantime, the data center consumes a lot of electric power and there is a demand for reducing power consumption from the viewpoint of energy conservation. In order to prevent failures or malfunctions of the computers due to the heat, a conceivable solution is to constantly rotate cooling fans each at the maximum number of revolutions. Nevertheless, there are many cooling fans disposed in the data center. If such many cooling fans are constantly rotated each at the maximum number of revolutions, the power consumption is increased and the reduction in power consumption is therefore unachievable.

Hence, in order to reduce the power consumption in the facility such as the data center, it is important to efficiently operate cooling equipment in accordance with the operational states of the computers.

Patent Document 1: Japanese Laid-open Patent Publication No. 2008-227127
Patent Document 2: Japanese Laid-open Patent Publication No. 2011-222029
Non-patent Document 1: ASTROM, K., and HAGGLUND, T.: "PID controllers: theory, design and tuning" (ISA Press, Research Triangle Park, N.C., 1995)

SUMMARY

According to an aspect of the disclosed technique, there is provided a temperature management system which includes a plurality of electronic devices each changing an amount of heat generation depending on its operational state, temperature detection units configured to individually detect temperatures of the plurality of electronic devices, a cooling device configured to cool the plurality of electronic devices, and a control unit configured to control the cooling device depending on outputs from the temperature detection units. Here, the control unit includes an idle state determination unit configured to determine whether or not the electronic devices are in an idle state, a manipulated variable calculation unit provided with an integrator and configured to calculate a manipulated variable by using a difference between a target value and a controlled variable, and an accumulation value correction unit configured to correct an accumulation value of the integrator with a predetermined value when the idle state determination unit determines that the electronic devices are in the idle state.

The object and advantages of the invention will be realized and attained by means of the elements and combinations particularly pointed out in the claims.

It is to be understood that both the foregoing general description and the following detailed description are exemplary and explanatory and are not restrictive of the invention.

BRIEF DESCRIPTION OF DRAWINGS

FIG. 6 is a view illustrating an example of an idle state determination map stored in an idle state determination map storage unit;
FIGS. 9A and 9B are graphs illustrating an example of temperature management by the temperature management system according to the first embodiment.

DESCRIPTION OF EMBODIMENTS

Before descriptions are provided for embodiments, a prelude for facilitating the understanding of the embodiments will be explained below.

As described previously, in order to reduce power consumption in a facility such as a data center, it is important to efficiently operate cooling equipment in accordance with operational states of electronic devices.

To this end, a conceivable solution is to measure a temperature of each computer, for example, and to subject each cooling fan to PID (proportional-integral-derivative) control depending on a deviation between the measured temperature and a target temperature thereof. However, application of general PID control to the cooling of the computer may cause a situation in which the control does not temporarily function when the computer transitions from an idle state to an operational state, and it may take a long period of time to achieve the target temperature.

This is attributed to occurrence of a phenomenon called reset windup, in which a deviation between a target value and a controlled variable is excessively accumulated in an integrator of a PID control unit when the computer is in the idle state. Due to the reset windup, the control does not function after the computer transitions from the idle state to the operational state until elimination of the deviation which is excessively accumulated in the integrator.

In general, in the PID control, the reset windup occurs at the time of transition to a condition where the controlled variable does not follow the target value, or at the time when the target value is set in such a range that the controlled variable does not follow under a certain condition.

Each of the following embodiments will describe a temperature management system, which is capable of suppressing deterioration in control performance attributed to the reset windup, and efficiently cooling a computer.

First Embodiment

Figure 1:
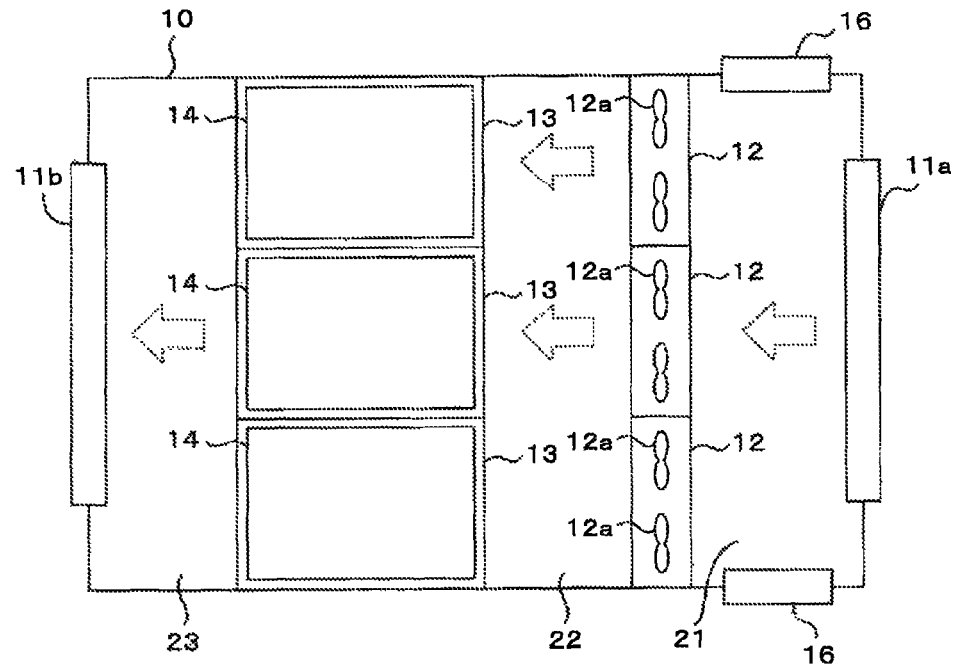
FIG. 1 is a schematic top view illustrating an example of a data center to which a temperature management system according to a first embodiment is applied.
Figure 2:
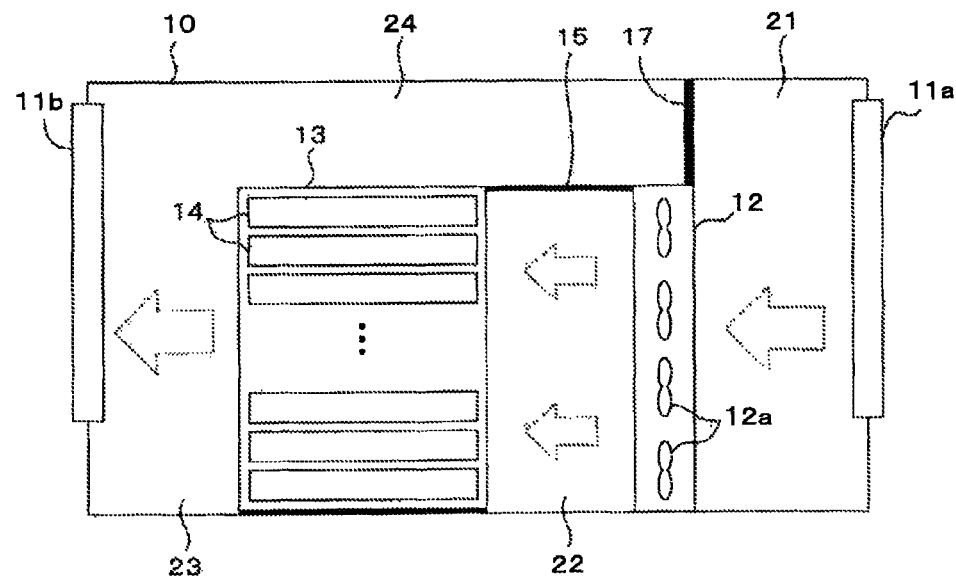
FIG. 2 is a schematic side view of the same data center.

FIG. 1 is a schematic top view illustrating an example of a data center to which a temperature management system according to a first embodiment is applied, and FIG. 2 is a schematic side view of the same data center. Note that this embodiment describes a modular data center as an example, which is configured to cool computers (servers) by utilizing outside air.

The modular data center illustrated as the example in FIG. 1 and FIG. 2 includes a container (an enclosure) 10 having a rectangular parallelepiped shape, cooling fan units 12 disposed inside the container 10, and a plurality of racks 13. Each rack 13 houses a plurality of computers 14.

An intake port 11a is provided to one of two faces of the container 10 which are opposite from each other, while an exhaust port 11b is provided to the other face thereof. Meanwhile, a partition plate 15 is disposed above a space between the cooling fan units 12 and the racks 13.

Each cooling fan unit 12 is provided with a plurality of cooling fans 12a. Moreover, the intake port 11a and the exhaust port 11b are each provided with a rainwater infiltration prevention plate to prevent infiltration of rainwater, and an insect screen to prevent intrusion of insects and the like. In this embodiment, each cooling fan unit 12 is provided for each rack 13 as illustrated in FIG. 1.

A space inside the container 10 is segmented into an outside air introduction portion 21, a cold aisle 22, a hot aisle 23, and a warm air circulation passage 24 by using the cooling fan units 12, the racks 13, and the partition plate 15. The outside air introduction portion 21 is a space between the intake port 11a and cooling fan units 12. The cold aisle 22 is a space between the cooling fan units 12 and the racks 13. The hot aisle 23 is a space between the racks 13 and the exhaust port 11b.

Each rack 13 is disposed such that its face on the cold aisle 22 side is an intake face and its face on the hot aisle 23 side is an exhaust face.

The warm air circulation passage 24 is a space above the racks 13 and the partition plate 15, which connects between the hot aisle 23 and the outside air introduction portion 21. The warm air circulation passage 24 is provided with a damper 17 for adjusting an amount of circulation of the warm air.

In the modular data center illustrated as the example in FIG. 1 and FIG. 2, the outside air introduction portion 21 is provided with evaporative cooling devices 16, each of which is configured to reduce a temperature of air to be introduced to the outside air introduction portion 21 by utilizing vaporization heat of water when an outside air temperature is high.

In the above-described modular data center, the cooling fans 12a in the cooling fan units 12 are rotated whereby the air (outside air) is introduced to the outside air introduction portion 21 through the intake port 11a. Then, the air introduced into the outside air introduction portion 21 moves to the cold aisle 22 through the cooling fan units 12, further enters the racks 13 from the intake faces of the racks 13, and cools the computers 14.

The air (warm air) with an increased temperature as a consequence of cooling the computers 14 is discharged from the exhaust faces of the racks 13 to the hot aisle 23, and is discharged from the exhaust port 11b to the outside.

Figure 3:
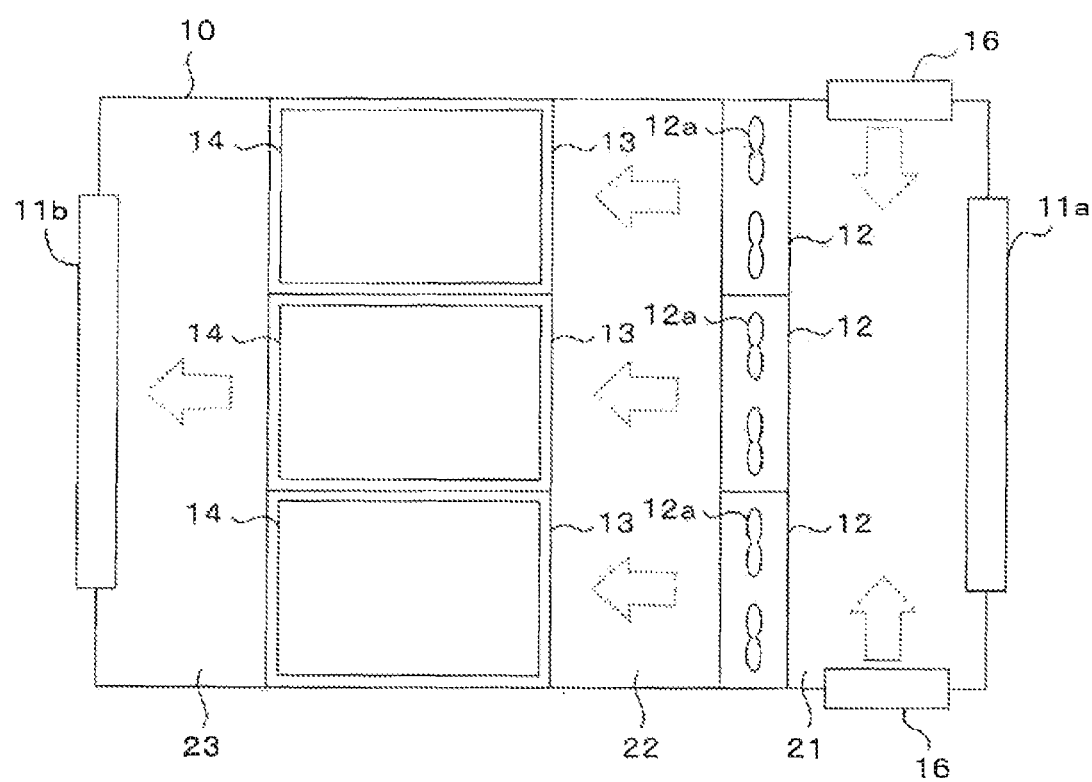
FIG. 3 is a schematic top view illustrating an example of introducing outside air into an outside air introduction portion through evaporative cooling devices in the same data center.

When the outside air temperature is high, the damper 17 is set to a closed state whereby the warm air is kept from moving from the hot aisle 23 to the outside air introduction portion 21. When the outside air temperature is even higher, the water is supplied to the evaporative cooling devices 16, and the outside air is introduced into the outside air introduction portion 21 through the evaporative cooling devices 16 as illustrated in FIG. 3. When the outside air passes through each evaporative cooling device 16, the water evaporates and draws the vaporization heat from its surroundings. As a consequence, the air at a lower temperature than the outside air temperature is introduced to the outside air introduction portion 21.

On the other hand, the damper 17 is set to an open state when the outside air temperature is low and the temperature of the air to be introduced into the racks 13 is likely to fall below the preset lowest allowable temperature. Thus, part of the warm air returns from the hot aisle 23 to the outside air introduction portion 21 through the warm air circulation passage 24, thereby increasing the temperature of the air to be introduced into the racks 13.

Figure 4:
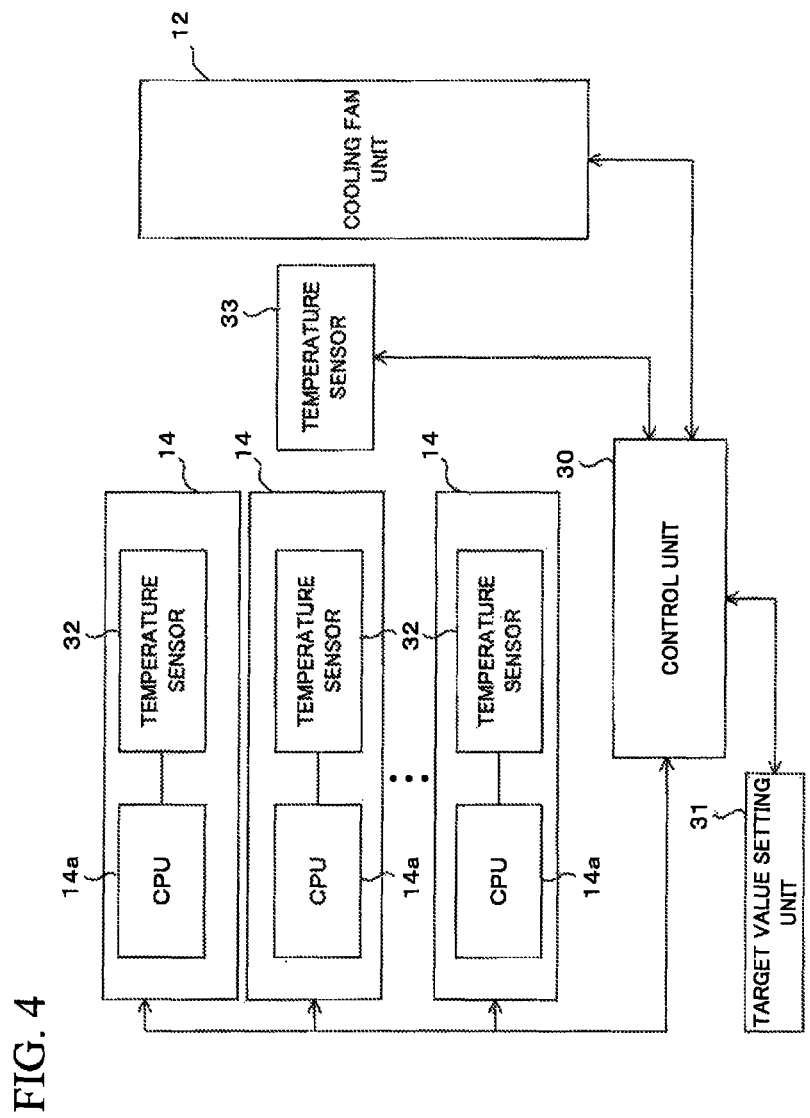
FIG. 4 is a block diagram illustrating the temperature management system according to the first embodiment.

FIG. 4 is a block diagram illustrating the temperature management system according to the first embodiment.

As illustrated in FIG. 4, the temperature management system according to this embodiment includes temperature sensors 32 configured to individually detect temperatures of CPUs 14a of the respective computers 14, a temperature sensor 33 configured to detect a temperature of the air on the intake face side of the racks 13, a control unit 30, a target value setting unit 31, and the cooling fan units 12. Each computer 14 is an example of an electronic device, each temperature sensor 32 is an example of a temperature detection unit, and each cooling fan unit 12 is an example of a cooling device.

The temperature sensor 32 is formed in the same chip as the one in which the CPU 14*a* is provided. The temperature sensor 32 transmits the temperature of the CPU 14*a* to the control unit 30 through a communication device (not illustrated) provided inside the computer 14.

In this embodiment, transmission and reception of signals between the control unit 30 and the computer 14 are assumed to be performed by way of UDP (user datagram protocol) communication. However, the communication between the control unit 30 and the computer 14 is not limited to the UDP communication. Meanwhile, in this embodiment, the temperature sensor disposed in the same chip as the one in which the CPU 14*a* is provided is used as the temperature sensor 32. Here, a temperature sensor disposed in close contact with a package of the CPU 14*a* may be used instead.

The control unit 30 is configured to include a microcomputer, an FPGA (field-programmable gate array), a PLC (programmable logic controller), or the like. Instead, a certain one of the computers 14 in the rack 13 may be caused to read a dedicated program and used as the control unit 30.

A target value of a CPU temperature is set to the target value setting unit 31. The target value is preferably such a temperature lower than the highest allowable temperature of the CPU 14*a*, and the target value may be changed depending on an operating condition of the CPU 14*a*. In this embodiment, an initial value of the target value is set to 80° C.

The control unit 30 controls the cooling fan units 12 depending on outputs from the temperature sensors 32 and 33 and the target value set to the target value setting unit 31. Details of operations of the control unit 30 will be described later.

Figure 5:
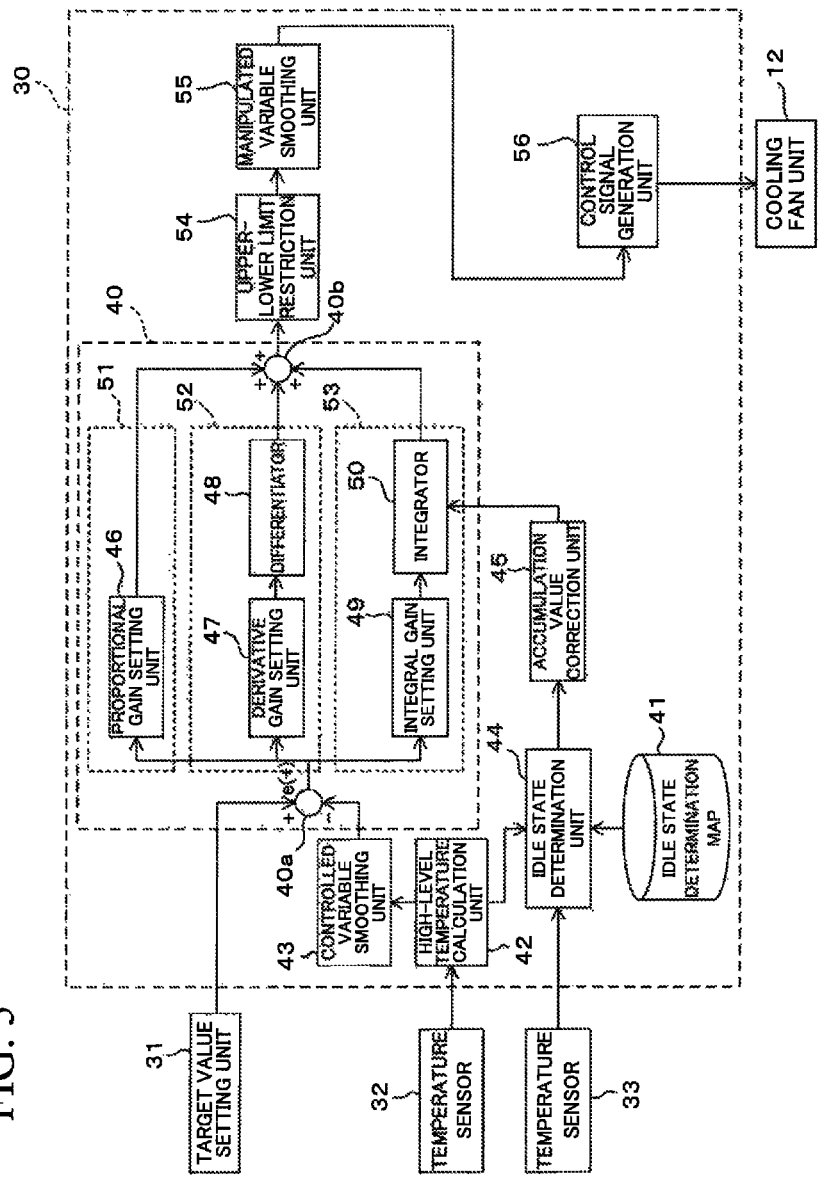
FIG. 5 is a functional block diagram describing a configuration of a control unit.

FIG. 5 is a functional block diagram describing a configuration of the control unit 30. As illustrated in FIG. 5, the control unit 30 includes a manipulated variable calculation unit 40, an idle state determination map storage unit 41, a high-level temperature calculation unit 42, a controlled variable smoothing unit 43, an idle state determination unit 44, an accumulation value correction unit 45, an upper-lower limit restriction unit 54, a manipulated variable smoothing unit 55, and a control signal generation unit 56.

Meanwhile, the manipulated variable calculation unit 40 includes calculators 40*a* and 40*b*, a proportional manipulated variable calculation module 51, a derivative manipulated variable calculation module 52, and an integral manipulated variable calculation module 53. The proportional manipulated variable calculation module 51 is configured to include a proportional gain setting unit 46. In the meantime, the derivative manipulated variable calculation module 52 is configured to include a derivative gain setting unit 47 and a differentiator 48. Furthermore, the integral manipulated variable calculation module 53 is configured to include an integral gain setting unit 49 and an integrator 50.

The idle state determination map storage unit 41 stores an idle state determination map indicating relations between the temperature of the air on the intake face side of the rack 13 and a reference temperature of the CPU 14*a* in the idle state.

FIG. 6 illustrates an example of the idle state determination map stored in the idle state determination map storage unit 41.

As illustrated in FIG. 6, the idle state determination map describes a relation between an intake air temperature Tc (the temperature of the air on the intake face side of the rack 13) and a reference temperature Ta (a CPU temperature) in the idle state for each data code.

The high-level temperature calculation unit 42 receives inputs of the CPU temperatures of the computers 14 from the temperature sensors 32, extracts a CPU temperature exceeding a reference value as described later, and outputs the extracted CPU temperature to the idle state determination unit 44 and the controlled variable smoothing unit 43. The controlled variable smoothing unit 43 performs smoothing of the CPU temperature inputted from the high-level temperature calculation unit 42, and outputs a resultant value to the manipulated variable calculation unit 40.

The idle state determination unit 44 receives an input of the temperature of the air on the intake face side of the racks 13 through the temperature sensor 33, and receives an input of the CPU temperature through the high-level temperature calculation unit 42. Then, the idle state determination unit 44 determines whether or not the CPUs 14*a* are in the idle state by using the inputted data and the idle state determination map stored in the idle state determination map storage unit 41.

A result of determination by the idle state determination unit 44 is transferred to the accumulation value correction unit 45. When the idle state determination unit 44 determines that the CPUs 14*a* are in the idle state, the accumulation value correction unit 45 corrects an accumulation value of the integrator 50 in the manipulated variable calculation unit 40 as described later.

The calculator 40*a* of the manipulated variable calculation unit 40 calculates a difference between the target value set to the target value setting unit 31 and the CPU temperature (a smoothed CPU temperature) inputted from the controlled variable smoothing unit 43.

The proportional manipulated variable calculation module 51 calculates a proportional manipulated variable $u_P$ from an output from the calculator 40*a* by using the proportional gain setting unit 46. Meanwhile, the derivative manipulated variable calculation module 52 calculates a derivative manipulated variable $u_D$ from the output from the calculator 40*a* by using the derivative gain setting unit 47 and the differentiator 48. Furthermore, the integral manipulated variable calculation module 53 calculates an integral manipulated variable $u_I$ from the output from the calculator 40*a* by using the integral gain setting unit 49 and the integrator 50.

The calculator 40*b* sums up the proportional manipulated variable $u_P$ outputted from the proportional manipulated variable calculation module 51, the derivable manipulated variable $u_D$ outputted from the derivative manipulated variable calculation module 52, and the integral manipulated variable $u_I$ outputted from the integral manipulated variable calculation module 53. A manipulated variable to be outputted from the calculator 40*b* is outputted to the upper-lower limit restriction unit 54 as an output from the manipulated variable calculation unit 40.

The upper-lower limit restriction unit 54 transfers the manipulated variable, which is outputted from the manipulated variable calculation unit 40, to the manipulated variable smoothing unit 55. However, the upper-lower limit restriction unit 54 transfers a preset upper limit to the manipulated variable smoothing unit 55 as the manipulated variable when the manipulated variable outputted from the manipulated variable calculation unit 40 is greater than the upper limit, and transfers a lower limit to the manipulated variable smoothing unit 55 as the manipulated variable when the aforementioned manipulated variable is smaller than the lower limit.

The manipulated variable smoothing unit 55 smoothes the manipulated variable transferred from the upper-lower limit restriction unit 54. The control signal generation unit 56 generates a control signal corresponding to the manipulated variable outputted from the manipulated variable smoothing unit 55. Each cooling fan 12*a* in the cooling fan unit 12 is rotated at the number of revolutions corresponding to the control signal outputted from the control signal generation unit 56.

Figure 7A:
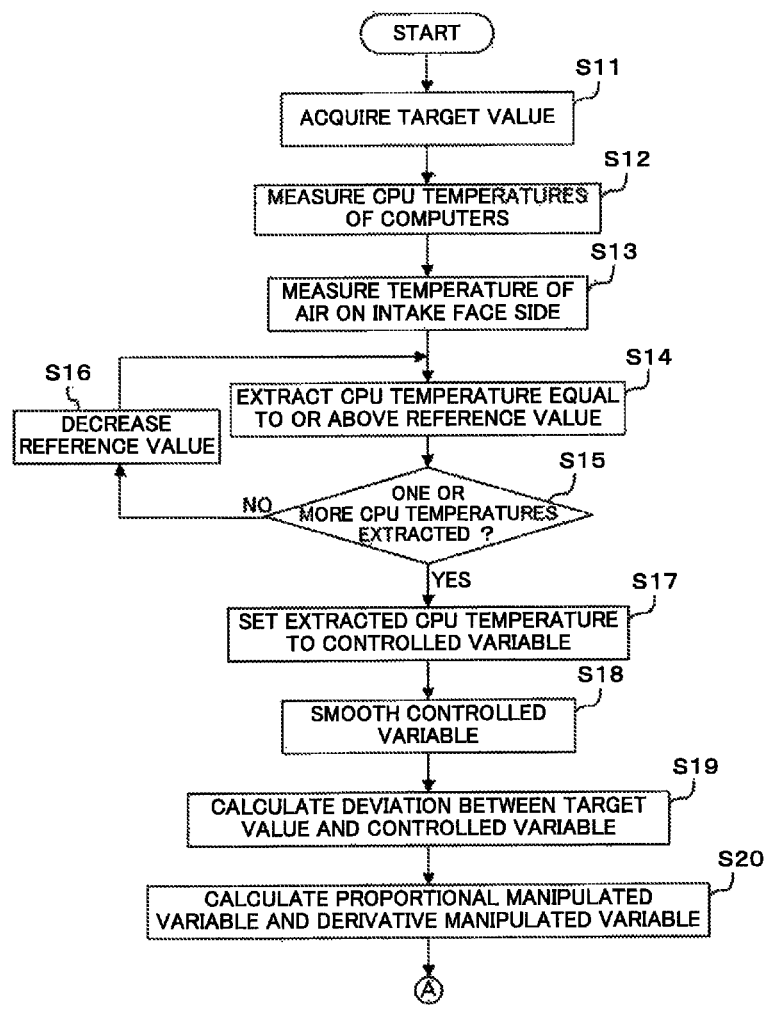
FIGS. 7A and 7B are flowcharts illustrating a temperature management method by the temperature management system according to the first embodiment.
Figure 7B:
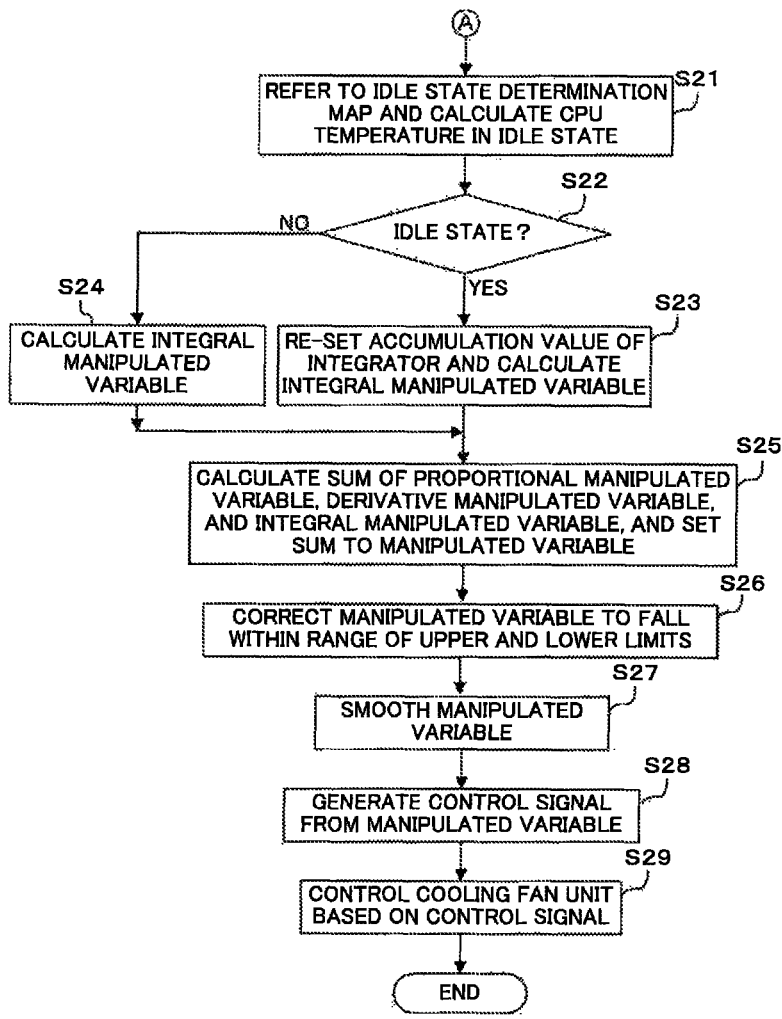

FIGS. 7A and 7B are flowcharts illustrating a temperature management method by the temperature management system according to this embodiment. The operations of the control unit 30 will be described further in detail with reference to the flowcharts. Here, it is assumed that the control unit 30 performs a sequence of the operations illustrated in FIGS. 7A and 7B for each rack 13 and at each given time interval (such as every second).

First, in step S11, the control unit 30 acquires the target value set to the target value setting unit 31.

Next, the process proceeds to step S12 where the control unit 30 acquires the CPU temperatures of the computers 14 through the temperature sensors 32. Meanwhile, in step S13, the control unit 30 acquires the temperature of the air on the intake face side of the rack 13 through the temperature sensor 33.

Next, the process proceeds to step S14 where the control unit 30 extracts a CPU temperature from measurement values of the CPU temperatures of the computers 14 acquired through the temperature sensors 32, the CPU temperature being equal to or above a reference value $\theta$.

Here, the reference value $\theta$ is defined as $0<\theta<T_{max}$. $T_{max}$ is a temperature at which the CPU 14*a* of each computer 14 starts throttling, for example. When the temperature of the CPU 14*a* reaches $T_{max}$, the CPU 14*a* automatically reduces its clock so as to prevent the temperature of the CPU 14*a* from rising to $T_{max}$ and above. In this embodiment, an initial value of the reference value $\theta$ is set to 100° C.

Next, in step S15, the control unit 30 determines whether or not at least one CPU temperature was successfully extracted. The process proceeds to step S16 if no CPU temperature is extracted, i.e., if there is no CPU 14*a* with the CPU temperature exceeding the reference value $\theta$ in the targeted rack 13. Thereafter, the control unit 30 decreases the reference value $\theta$ just by an amount $\phi$, and then the process proceeds to step S14. The amount $\phi$ is calculated by the following formula (1).

[Formula 1]

$$\phi = T_{max} \cdot \alpha \quad (1)$$

Here, $\alpha$ is a constant which determines an amount of decrease in value of the reference value $\theta$, which is an arbitrary value smaller than 1. However, delicate temperature control is infeasible if the value $\alpha$ is too large, and the control becomes complicated if the value $\alpha$ is too small. In this embodiment, the value $\alpha$ is set to 0.01.

In this way, the control unit 30 repeats the step S14 to step S16 until at least one CPU temperature exceeding the reference value $\theta$ is extracted.

When at least one CPU temperature exceeding the reference value $\theta$ is extracted in step S14, the process proceeds to step S17 from step S15. In step S17, the control unit 30 sets the CPU temperature acquired in step S14 to a controlled variable y(s). When there are two or more CPU temperatures extracted in step S14, either an average value or the highest value thereof is set to the controlled variable y(s).

The above-described operations from step S14 to step S17 are executed by the high-level temperature calculation unit 42.

Thereafter, the process proceeds to step S18 where the control unit 30 performs smoothing in order to smooth a fluctuation in the controlled variable y(s). The smoothing is executed by the controlled variable smoothing unit 43.

This embodiment applies a primary delay transfer function F(s) as a smoothing method. In this case, if a controlled variable before the smoothing is $y_{in}$, a controlled variable $y_{out}$ after the smoothing is calculated by the following formula (2).

[Formula 2]

$$y_{out}(s) = F(s) y_{in}(s) \quad (2)$$

Here, the primary delay transfer function F(s) is expressed by the following formula (3).

[Formula 3]

$$F(s) = \frac{1}{1 + T_f s} \quad (3)$$

In formula (3), s is a Laplace operator. Meanwhile, $T_f$ is a filter time constant. The controlled variable becomes smoother through time as the value $T_f$ is greater. However, a control response becomes slower instead. In this embodiment, $T_f$ is set equal to 5.

Instead of the primary delay transfer function, it is also possible to perform the smoothing by using Kalman filter and the like.

Next, the process proceeds to step S19 where the control unit 30 calculates a deviation e(t) between a target value r(t) acquired from the target value setting unit 31 and the smoothed controlled variable y(t), by the following formula (4).

[Formula 4]

$$e(t) = y(t) - r(t) \quad (4)$$

This calculation is performed by the calculator 40*a*.

Meanwhile, in step S20, the control unit 30 calculates a proportional manipulated variable $u_P(t)$ depending on the deviation e(t) by the following formula (5).

[Formula 5]

$$u_P(t) = K_P e(t) \quad (5)$$

Moreover, the control unit 30 calculates a derivative manipulated variable $u_D(t)$ depending on an amount of change in the deviation e(t) by the following formula (6).

[Formula 6]

$$u_D(t) = K_D \frac{de(t)}{dt} \quad (6)$$

Here, $K_P$ is a proportional gain and $K_D$ is a derivative gain. The derivative gain $K_D$ may also be expressed with the proportional gain $K_P$ and derivative time $T_D$ as in the following formula (7).

[Formula 7]

$$K_D = K_P T_D \qquad (7)$$

These calculations are performed by the proportional manipulated variable calculation module 51 and the derivative manipulated variable calculation module 52 of the manipulated variable calculation unit 40.

Next, the process proceeds to step S21 where the control unit 30 refers to the idle state determination map stored in the idle state determination map storage unit 41. Then, the temperature of the air on the intake face side is used as a search key to acquire a predetermined number of data codes having values close to the temperature of the air on the intake face side. Thereafter, interpolation processing is performed as described later by using the temperature Tc of the air on the intake face side of the rack 13 and the reference temperature Ta of the CPU in the idle state, thereby finding a CPU reference temperature $Ta_{base}$ in the idle state.

For example, when the linear interpolation is performed by acquiring two points $(Tc_i, Ta_i)$ and $(Tc_{i+1}, Ta_{i+1})$ from the idle state determination map, the CPU reference temperature $Ta_{base}$ in the idle state is calculated from a current intake air temperature $Tc_{in}$ by the following formula (8).

[Formula 8]

$$Ta_{base} = \left(\frac{Ta_{i+1} - Ta_i}{T_{Ci+1} - T_{Ci}}\right)(Tc_{in} - Tc_i) + Ta_i \qquad (8)$$

If the interpolation is performed by acquiring three or more points from the idle state determination map, then it is also possible to use Lagrange's interpolation as indicated in the following formula (9).

[Formula 9]

$$Ta_{base} = \sum_{k=0}^{M}\left(\prod_{j=0}^{M(j+k)} \frac{Tc_{in} - Tc_j}{Tc_k - Tc_j}\right) Ta_k \qquad (9)$$

Here, M is the number of the data acquired. In addition, it is also possible to use spline interpolation and the like.

Next, in step S22, the control unit 30 determines whether or not the computers 14 are in the idle state. Here, the computers 14 are determined to be in the idle state when the value of the CPU temperature (the controlled variable y(s)) transferred from the high-level temperature calculation unit 42 is smaller than a value $Ta_{base}+\beta$, i.e., when $Ta_{base}+\beta > y(s)$ holds true.

Here, β is a parameter for taking into account a fluctuation in the CPU temperature in the idle state, which is a positive number. In this embodiment, β is set to 5° C. When the value β is large, a criterion for determination of the idle state is relaxed and a temperature range applicable to the determination as being in the idle state is expanded. When the value β is small, the criterion for determination of the idle state becomes strict and the temperature range applicable to the determination as being in the idle state is narrowed.

The process proceeds to step S23 in the case of the determination as being in the idle state (in the case of YES) in step S22, or proceeds to step S24 from step S22 in the case of the determination as not being in the idle state (in the case of NO) therein.

In step S23, an accumulation value S(t) of the integrator 50 is re-set to a predetermined value γ as indicated in the following formula (10). In this embodiment, γ is set equal to 0.

[Formula 10]

$$S(t) = \gamma \qquad (10)$$

Thereafter, an integral manipulated variable $u_I(t)$ is calculated by the following formula (11) with the integral manipulated variable calculation module 53. Then, the process proceeds to step S25.

On the other hand, when the process proceeds to step S24 from step S22, the control unit 30 calculates the integral manipulated variable $u_I(t)$ by the following formula (11) with the integral manipulated variable calculation module 53.

[Formula 11]

$$u_I(t) = K_I S(t) \qquad (11)$$

Here, S(t) is the accumulated value of the integrator 50 and $K_I$ is an integral gain. The integral gain $K_I$ is expressed with the proportional gain $K_P$ and integral time $T_I$ as indicated in the following formula (12).

[Formula 12]

$$K_I = \frac{K_P}{T_I} \qquad (12)$$

The integral calculation is expressed with a discretized equation in order to facilitate the explanation. In this embodiment, the integral calculation is to be calculated by the following formula (13) by adopting the modified Euler method (the trapezoidal rule).

[Formula 13]

$$S(t) = S(t - \Delta t) + \frac{e(t) + e(t - \Delta t)}{2}\Delta t \qquad (13)$$

Here, Δt is step time. After the integral manipulated variable $u_I(t)$ is calculated, the process proceeds to step S25.

In step S25, the control unit 30 calculates a sum of the outputs from the proportional manipulated variable calculation module 51, the derivative manipulated variable calculation module 52, and the integral manipulated variable calculation module 53 by using the calculator 40b, and outputs the calculated sum as the manipulated variable. Since this embodiment explains the case of subjecting the cooling fan unit 12 to the PID control, a manipulated variable u(t) is calculated by the following formula (14).

[Formula 14]

$$u(t) = u_P(t) + u_I(t) + u_D(t) \qquad (14)$$

Here, if the cooling fan unit 12 is subjected to PI (proportional-integral) control, then the manipulated variable u(t) is calculated by the following formula (15).

[Formula 15]

$$u(t) = u_P(t) + u_I(t) \quad (15)$$

Next, in step S26, the control unit 30 corrects the manipulated variable u(t) by the following formula (16) or formula (17), as needed, such that the manipulated variable u(t) falls within a range of $u_{min} \leq u(t) \geq u_{max}$.

[Formula 16]

$$u(t) = u_{max}(u(t) > u_{max}) \quad (16)$$

[Formula 17]

$$u(t) = u_{min}(u(t) < u_{min}) \quad (17)$$

This operation is performed by the upper-lower limit restriction unit 54.

Next, the process proceeds to step S27 where the control unit 30 smoothes the manipulated variable u(t) by using the above-described primary delay transfer function, for example. Here, the value of the filter time constant $T_f$ when smoothing the manipulated variable u(t) is set to $T_f = 10$.

Next, the process proceeds to step S28 where the control unit 30 generates the control signal for the cooling fan unit 12 from the manipulated variable u(t) by using the control signal generation unit 56. In this embodiment, a PWM (pulse width modulation) signal is to be generated in order to control the cooling fans 12a.

Subsequently, the process proceeds to step S29 where the control unit 30 controls the number of revolutions of each cooling fan 12a in the cooling fan unit 12 on the basis of the control signal.

As described above, in this embodiment, the control unit 30 re-sets the accumulation value S(t) of the integrator 50 of the integral manipulated variable calculation module 53 to the predetermined value γ in the idle state. For this reason, the deviation is not excessively accumulated in the integrator 50 in the idle state, so that the control is properly conducted after the transition from the idle state to the operational state, and the computers 14 are cooled stably and efficiently.

Meanwhile, in this embodiment, the controlled variable y(s) is smoothed by the controlled variable smoothing unit 43 and the manipulated variable u(t) is smoothed by the manipulated variable smoothing unit 55. Accordingly, a useful and smooth manipulated variable is generated instead of an oscillatory manipulated variable which is in fact impracticable.

Furthermore, in this embodiment, the CPU temperatures are directly measured by using the temperature sensors 32, and the cooling fan unit 12 is controlled in such a way that the CPU temperature at a high level does not exceed the target value. Thus, it is possible to perform the cooling efficiently depending on the CPU temperatures. Accordingly, reduction in power consumption of the data center may be achieved while avoiding occurrence of a problem attributed to the heat of the computer 14.

Figure 8A:
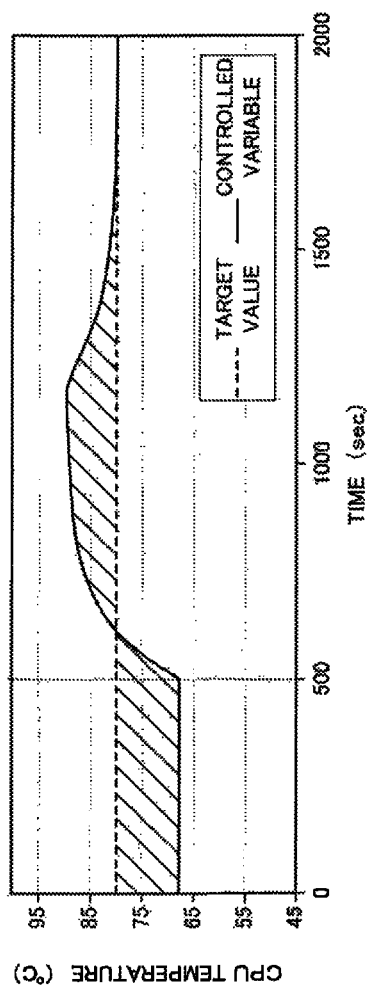
FIGS. 8A and 8B are graphs illustrating an example (a comparative example) of temperature management according to a conventional method using PID control.
Figure 8B:
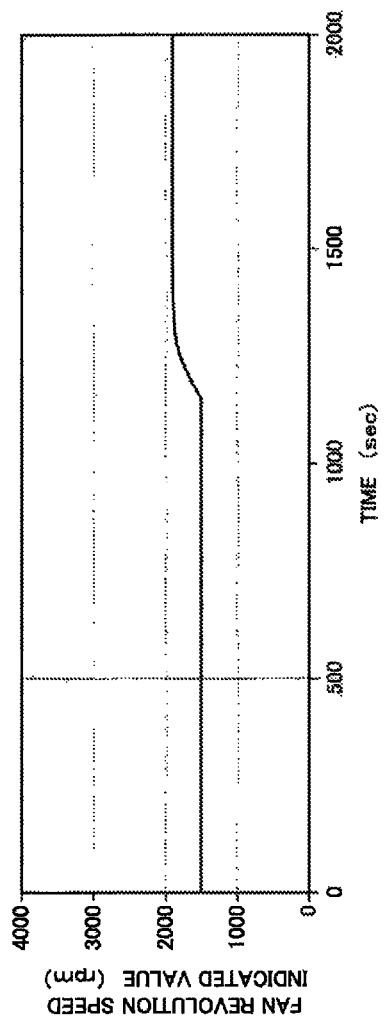

FIGS. 8A and 8B are graphs illustrating an example, as a comparative example, of temperature management according to a conventional method using the PID control. FIG. 8A illustrates a change over time of a CPU temperature and FIG. 8B illustrates a change over time of a control signal (a fan revolution speed indicated value) to be supplied from a control unit to a cooling fan unit.

In the example illustrated in FIGS. 8A and 8B, the target temperature is set to 80° C., and the transition from the idle state to the operational state takes place 500 seconds later.

Note that a solid line in FIG. 8A is an actual measurement value of the CPU temperature and a dashed line therein is the target temperature.

As clear from FIGS. 8A and 8B, in the conventional method, when the CPU temperature is increased 500 seconds later and exceeds the target value thereafter, the control does not function for some time and a large overshoot of the CPU temperature is observed.

FIGS. 9A and 9B are graphs illustrating an example of temperature management by the temperature management system according to this embodiment. FIG. 9A illustrates a change over time of a CPU temperature and FIG. 9B illustrates a change over time of a control signal (a fan revolution speed indicated value) to be supplied from the control unit 30 to the cooling fan unit 12. In the example illustrated in FIGS. 9A and 9B, the target temperature is set to 80° C., and the transition from the idle state to the operational state takes place 500 seconds later.

As clear from FIGS. 9A and 9B, according to the temperature management system according to this embodiment, when the computers 14 transition from the idle state to the operational state, the fan revolution speed indicated value quickly responds to the transition and the number of revolutions of each cooling fan 12a is increased. Then, the CPU temperature reaches the target temperature about 1100 seconds later, and the CPU temperature is maintained at the target temperature thereafter.

Figure 10A:
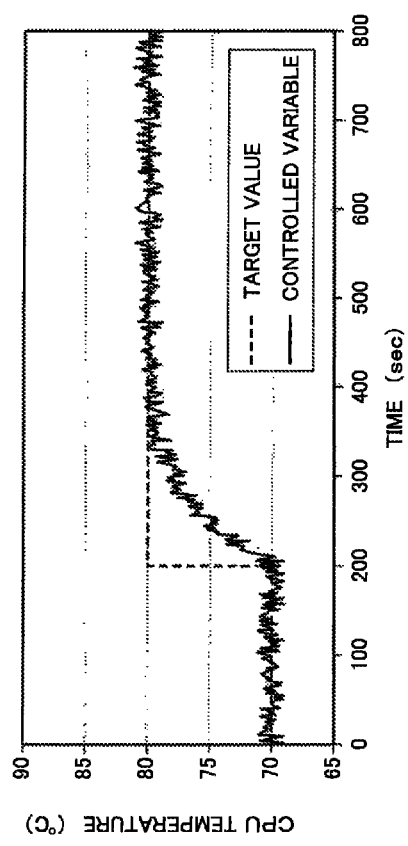
FIGS. 10A and 10B are graphs illustrating the example (the comparative example) of the temperature management according to the conventional method in a situation where observation noise is added.
Figure 10B:
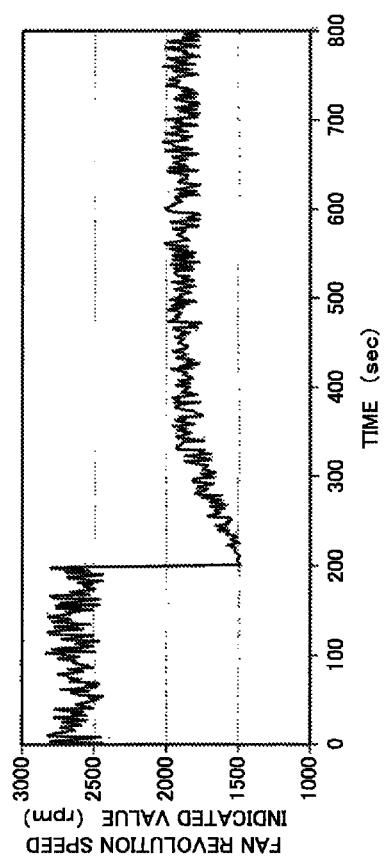

FIGS. 10A and 10B are graphs illustrating the example, as the comparative example, of the temperature management according to the conventional method in a situation where observation noise is added. FIG. 10A illustrates a change over time of a CPU temperature and FIG. 10B illustrates a change over time of a fan revolution speed indicated value being a control signal to be supplied from the control unit to the cooling fan unit.

In the example illustrated in FIGS. 10A and 10B, an initial value of the target temperature is set to 70° C. and the target temperature is changed to 80° C. about 200 seconds later. Note that a solid line in FIG. 10A is an actual measurement value of the CPU temperature and a dashed line therein is the target temperature.

As clear from FIGS. 10A and 10B, it turns out that the conventional method generates the control signal (the fan revolution speed indicated value), which is oscillatory and may hardly be followed by the actual cooling fan unit 12.

Figure 11A:
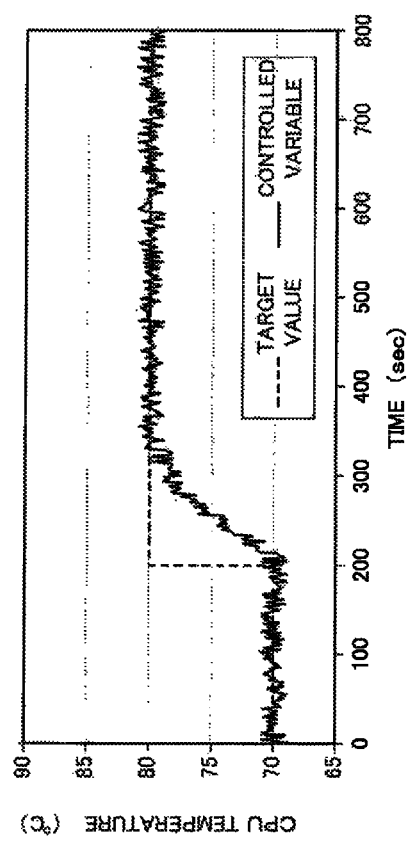
FIGS. 11A and 11B are graphs illustrating the example of the temperature management by the temperature management system according to the first embodiment in a situation where observation noise is added.
Figure 11B:
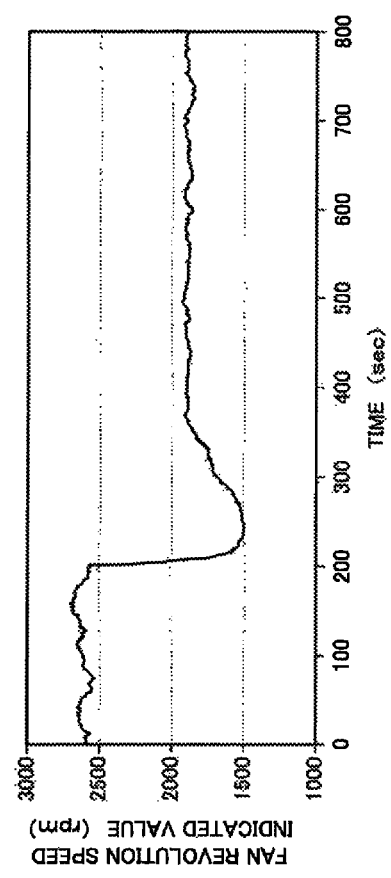

FIGS. 11A and 11B are graphs illustrating the example of the temperature management by the temperature management system according to this embodiment in a situation where observation noise is added. FIG. 11A illustrates a change over time of a CPU temperature and FIG. 11B illustrates a change over time of a control signal (a fan revolution speed indicated value) to be supplied from the control unit 30 to the cooling fan unit 12.

In the example illustrated in FIGS. 11A and 11B, an initial value of the target temperature is set to 70° C. and the target temperature is changed to 80° C. about 200 seconds later. Note that a solid line in FIG. 11A is an actual measurement value of the CPU temperature and a dashed line therein is the target temperature.

As clear from FIGS. 11A and 11B, the temperature management system according to this embodiment generates a smooth control signal which may be followed by the actual cooling fan unit 12 even when the controlled variable is oscillatory. In addition, the response is kept from significant deteriorating as compared to the conventional method, and the cooling control is achieved properly.

Second Embodiment

Figure 12:
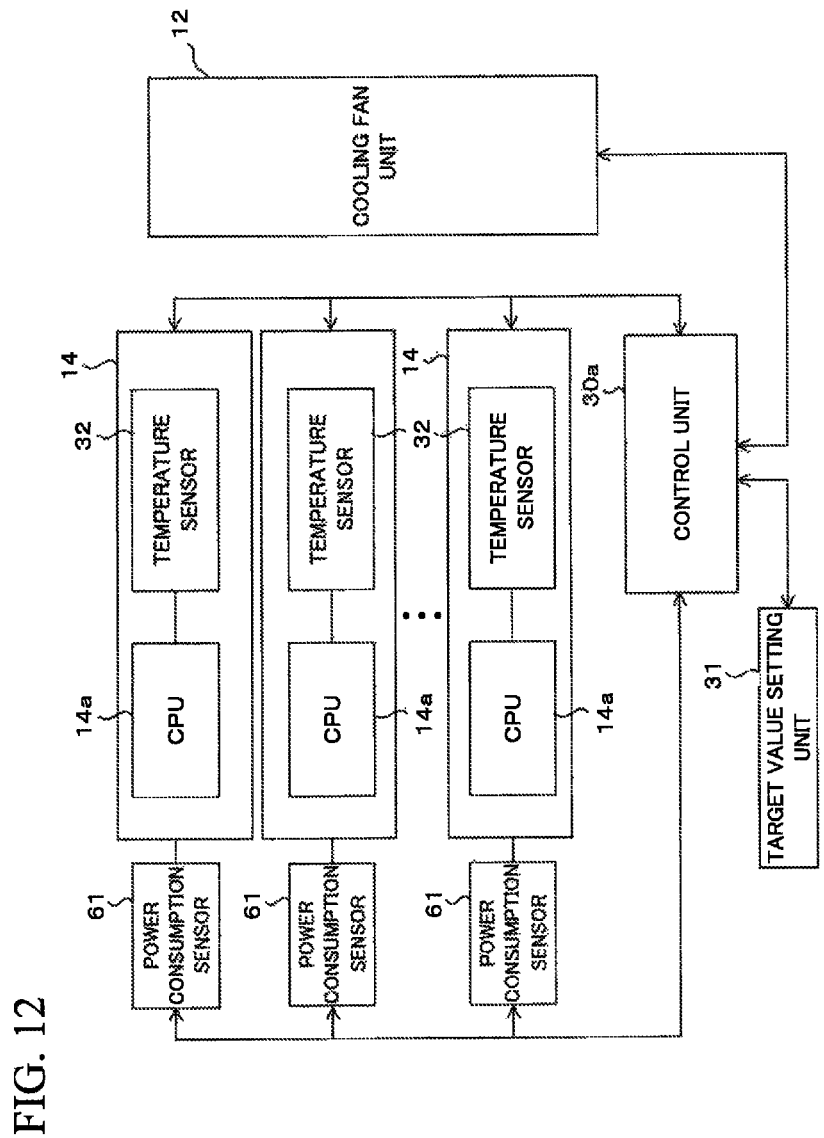
FIG. 12 is a block diagram illustrating a temperature management system according to a second embodiment.

FIG. 12 is a block diagram illustrating a temperature management system according to a second embodiment. This embodiment is different from the first embodiment in that the determination as to whether or not a computer is in the idle state is made on the basis of power consumption of the computer. The rest of the configurations are basically the same as those of the first embodiment. For this reason, in FIG. 12, the same constituents as those in FIG. 4 will be denoted by the same reference numerals and detailed descriptions thereof will be omitted. In addition, this embodiment will also be described with reference to FIG. 1 and FIG. 2.

As illustrated in FIG. 12, in the temperature management system according to this embodiment, each computer 14 is provided with a power consumption sensor 61, and power consumption of each computer 14 is inputted on a real-time basis from the corresponding power consumption sensor 61 to a control unit 30a. Each power consumption sensor 61 is an example of a power consumption detection unit.

The power consumption of each computer 14 is small in the idle state, and grows larger as an operating rate of the corresponding CPU 14a becomes higher. For this reason, it is possible to determine whether or not the computer 14 is in the idle state by monitoring its power consumption.

Figure 13:
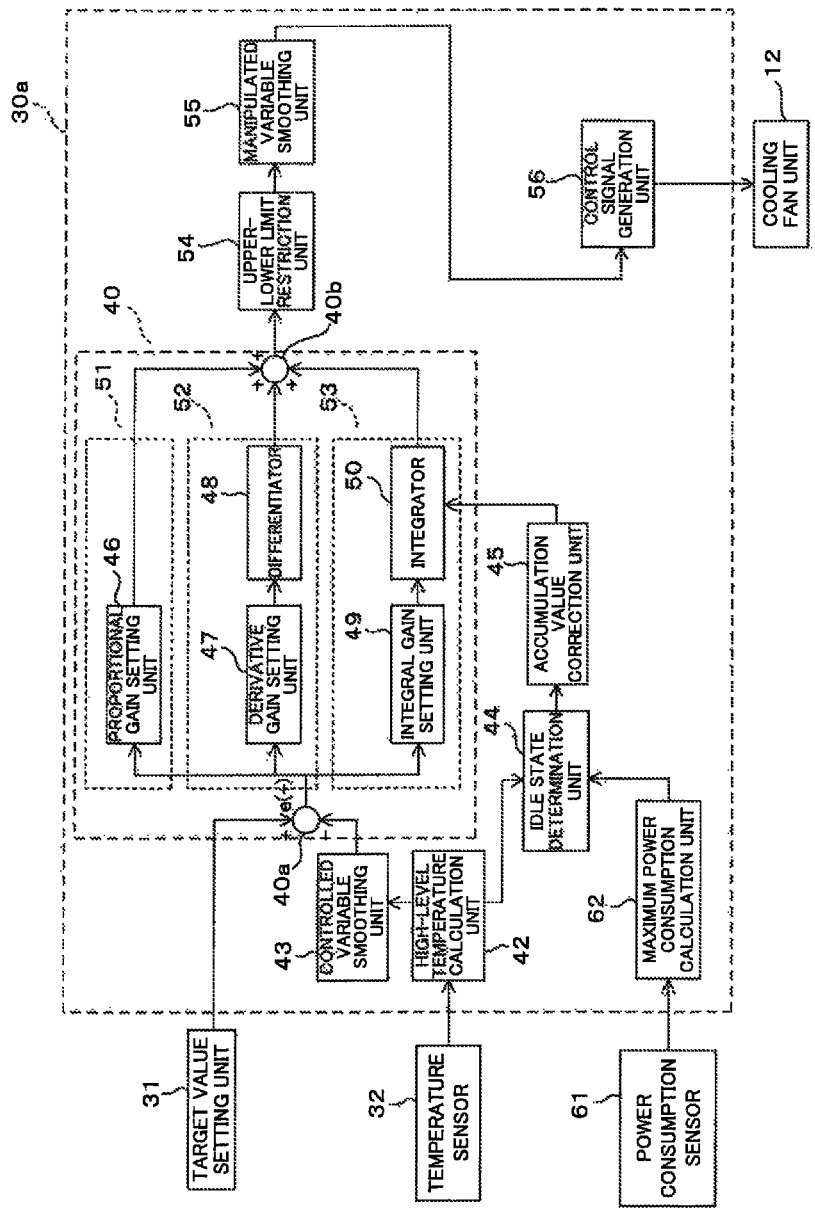
FIG. 13 is a functional block diagram describing a configuration of a control unit of the temperature management system according to the second embodiment.

FIG. 13 is a functional block diagram describing a configuration of the control unit 30a. In FIG. 13, the same constituents as those in FIG. 5 will be denoted by the same reference numerals and detailed descriptions thereof will be omitted.

An output from each power consumption sensor 61 provided to the corresponding computer 14 is transferred to a maximum power consumption calculation unit 62. The maximum power consumption calculation unit 62 extracts a maximum value of the power consumption (maximum power consumption) out of values of power consumption of the computers 14 provided by the respective power consumption sensors 61.

The idle state determination unit 44 determines whether or not the computers 14 are in the idle state by using the CPU temperature provided through the high-level temperature calculation unit 42 and the maximum power consumption provided from the maximum power consumption calculation unit 62.

For example, the idle state determination unit 44 determines as being in the idle state when the maximum power consumption provided from the maximum power consumption calculation unit 62 is lower than a preset value or when the CPU temperature provided from the high-level temperature calculation unit 42 is lower than a preset temperature.

On the other hand, the idle state determination unit 44 determines as not being in the idle state when the maximum power consumption provided from the maximum power consumption calculation unit 62 is equal or above the preset value and when the CPU temperature provided from the high-level temperature calculation unit 42 is equal to or above the preset temperature.

Meanwhile, the accumulation value correction unit 45 corrects the accumulation value of the integrator 50 in the manipulated variable calculation unit 40 when the idle state determination unit 44 determines that the computers 14 are in the idle state.

Figure 14A:
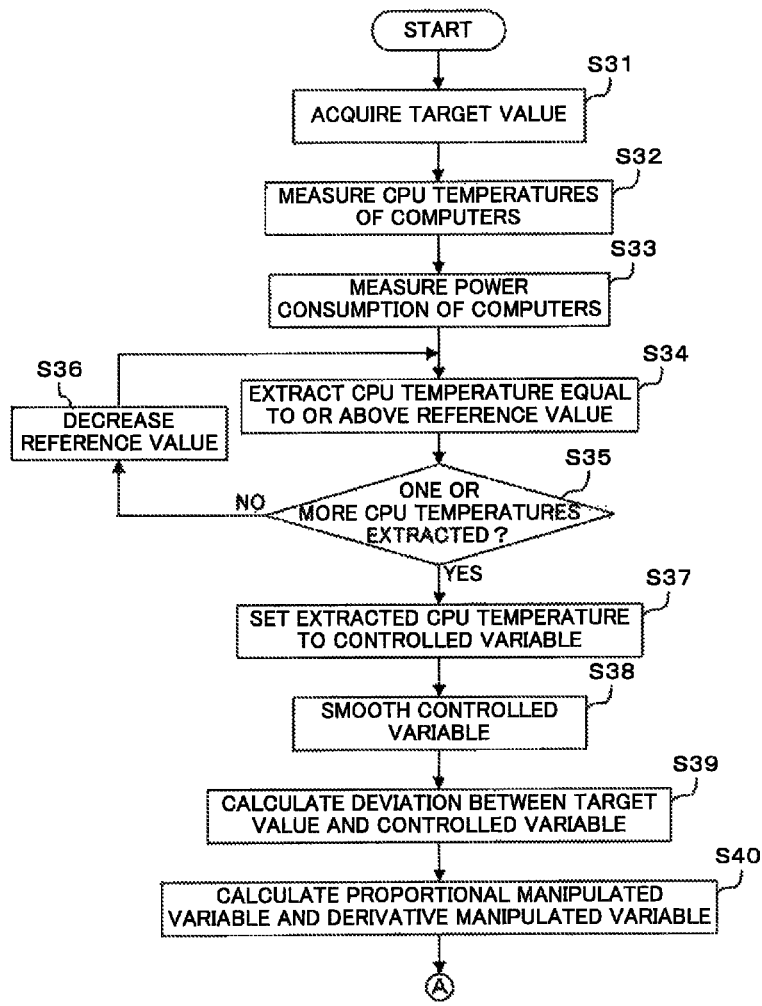
FIGS. 14A and 14B are flowcharts illustrating a temperature management method by the temperature management system according to the second embodiment.
Figure 14B:
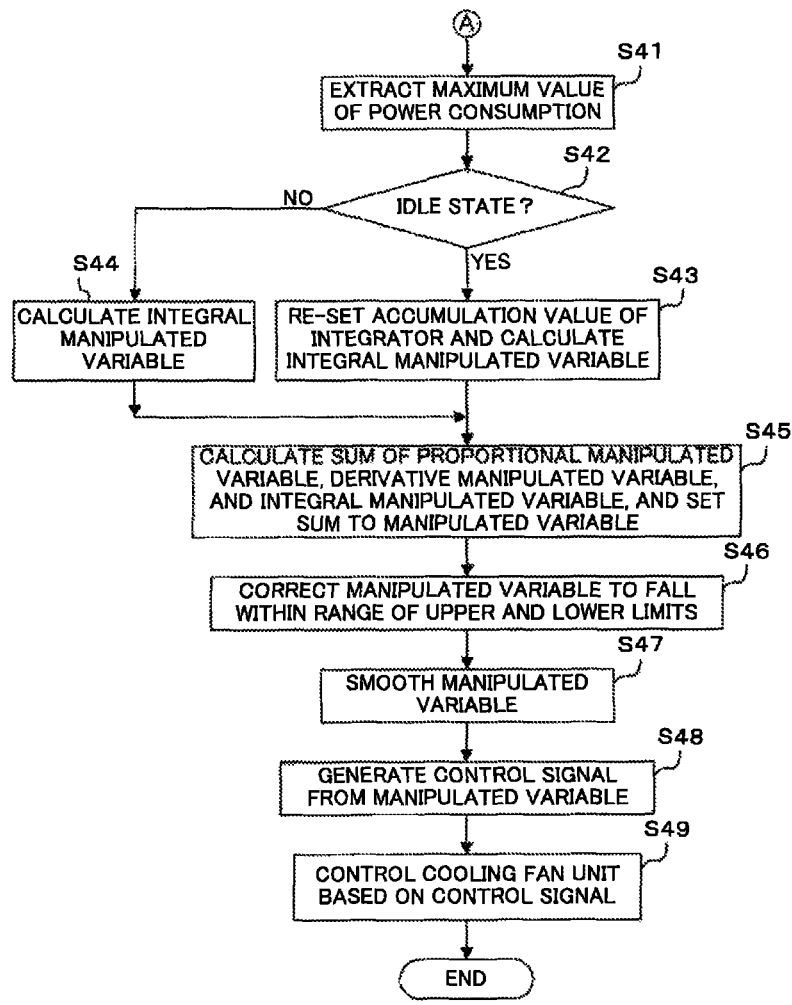

FIGS. 14A and 14B are flowcharts illustrating a temperature management method by the temperature management system according to this embodiment. Operations of the control unit 30a will be described further in detail with reference to the flowcharts. Here, it is assumed that the control unit 30a performs a sequence of the operations illustrated in FIGS. 14A and 14B for each rack 13 and at each given time interval (such as every second).

First, in step S31, the control unit 30a acquires the target value set to the target value setting unit 31.

Next, the process proceeds to step S32 where the control unit 30a acquires the CPU temperatures of the computers 14 through the temperature sensors 32. Meanwhile, in step S33, the control unit 30a acquires the values of power consumption of the computers 14 through the power consumption sensors 61.

Next, the process proceeds to step S34 where the control unit 30a extracts a CPU temperature from the measurement values of the CPU temperatures of the computers 14 acquired through the temperature sensors 32, the CPU temperature being equal to or above the reference value θ.

Next, in step S35, the control unit 30a determines whether or not at least one CPU temperature was successfully extracted. The process proceeds to step S36 if no CPU temperature is extracted, i.e., if there is no CPU 14a with the CPU temperature exceeding the reference value θ in the targeted rack 13. Then, the control unit 30a decreases the reference value θ just by the amount φ calculated by the above-described formula (1). Thereafter, the process proceeds to step S34.

In this way, the control unit 30a repeats the step S34 to step S36 until at least one CPU temperature exceeding the reference value θ is extracted.

When at least one CPU temperature exceeding the reference value θ is extracted in step S34, the process proceeds to step S37 from step S35. In step S37, the control unit 30a sets the CPU temperature acquired in step S34 to the controlled variable y(s). When there are two or more CPU temperatures extracted in step S34, either the average value or the highest value thereof is set to the controlled variable y(s).

The above-described operations from step S34 to step S37 are executed by the high-level temperature calculation unit 42.

Thereafter, the process proceeds to step S38 where the control unit 30a performs the smoothing in order to smooth the fluctuation in the controlled variable y(s). The smoothing is executed by the controlled variable smoothing unit 43.

Next, the process proceeds to step S39 where the control unit 30a calculates the deviation e(t) between the target value r(t) acquired from the target value setting unit 31 and the smoothed controlled variable y(s). This calculation is performed by the calculator 40a.

Next, the process proceeds to step S40 where the control unit 30a calculates the proportional manipulated variable $u_P(t)$ depending on the deviation e(t) by the above-described formula (5). Moreover, the control unit 30a calculates the derivative manipulated variable $u_D(t)$ depending on the amount of change in the deviation e(t) by the above-described formula (6).

These calculations are performed by the proportional manipulated variable calculation module 51 and the derivative manipulated variable calculation module 52 of the manipulated variable calculation unit 40.

Next, the process proceeds to step S41 where the control unit 30a uses the maximum power consumption calculation unit 62 to extract the maximum power consumption from the values of power consumption of the computers 14 inputted from the power consumption sensors 61.

Next, the process proceeds to step S42 where the control unit 30a uses the CPU temperature extracted by the high-level temperature calculation unit 42 and the maximum power consumption extracted by the maximum power consumption calculation unit 62 to determine whether or not the computers 14 are in the idle state by the idle state determination unit 44.

Specifically, the idle state determination unit 44 determines as being in the idle state when the CPU temperature extracted by the high-level temperature calculation unit 42 is lower than the preset temperature or when the maximum power consumption extracted by the maximum power consumption calculation unit 62 is lower than the preset value. On the other hand, the idle state determination unit 44 determines as not being in the idle state when the CPU temperature extracted by the high-level temperature calculation unit 42 is equal to or above the preset temperature and when the maximum power consumption extracted by the maximum power consumption calculation unit 62 is equal to or above the preset value.

The process proceeds to step S43 in the case of the determination as being in the idle state (in the case of YES) in step S42, or proceeds to step S44 from step S42 in the case of the determination as not being in the idle state (in the case of NO) therein.

In step S43, the accumulation value S(t) of the integrator 50 is re-set to the predetermined value γ as indicated in the above-described formula (10). In this embodiment as well, γ is set equal to 0. Thereafter, the integral manipulated variable $u_I(t)$ is calculated by the above-described formula (11). Then, the process proceeds to step S45.

On the other hand, when the process proceeds to step S44 from step S42, the integral manipulated variable $u_I(t)$ is calculated by the above-described formula (11). After the integral manipulated variable $u_I(t)$ is calculated, the process proceeds to step S45.

In step S45, the control unit 30a calculates the sum of the outputs from the proportional manipulated variable calculation module 51, the derivative manipulated variable calculation module 52, and the integral manipulated variable calculation module 53 by the above-described formula (14) with using the calculator 40b, and outputs the calculated sum as the manipulated variable u(t).

Next, in step S46, the control unit 30a corrects the manipulated variable u(t) by the above-described formula (16) or formula (17), as needed, such that the manipulated variable u(t) falls within the range of $u_{min} \leq u(t) \leq u_{max}$.

Next, the process proceeds to step S47 where the control unit 30a smoothes the manipulated variable u(t) with the manipulated variable smoothing unit 55.

Next, the process proceeds to step S48 where the control unit 30a generates the control signal for the cooling fan unit 12 from the manipulated variable u(t) by using the control signal generation unit 56.

Subsequently, the process proceeds to step S49 where the control unit 30a controls the number of revolutions of each cooling fan 12a in the cooling fan unit 12 on the basis of the control signal.

As described above, in this embodiment, the determination as to whether or not the computers 14 are in the idle state is made on the basis of the power consumption of the computer 14.

In this embodiment, the control unit 30a re-sets the accumulation value S(t) of the integrator 50 of the integral manipulated variable calculation module 53 to the predetermined value γ in the idle state as in the case of the first embodiment. For this reason, the deviation is not excessively accumulated in the integrator 50 in the idle state, so that the control is properly conducted after the transition from the idle state to the operational state, and the computers 14 are cooled stably and efficiently.

Meanwhile, in this embodiment, the controlled variable y(s) is smoothed by the controlled variable smoothing unit 43 and the manipulated variable u(t) is smoothed by the manipulated variable smoothing unit 55. Accordingly, a useful and smooth manipulated variable is generated instead of an oscillatory manipulated variable which is in fact impracticable.

Furthermore, in this embodiment, the CPU temperatures are directly measured by using the temperature sensors 32, and the cooling fan unit 12 is controlled in such a way that the CPU temperature at a high level does not exceed the target value. Thus, it is possible to perform the cooling efficiently depending on the CPU temperatures. Accordingly, reduction in power consumption of the data center may be achieved while avoiding occurrence of a problem attributed to the heat of the computer 14.

Third Embodiment

Figure 15:
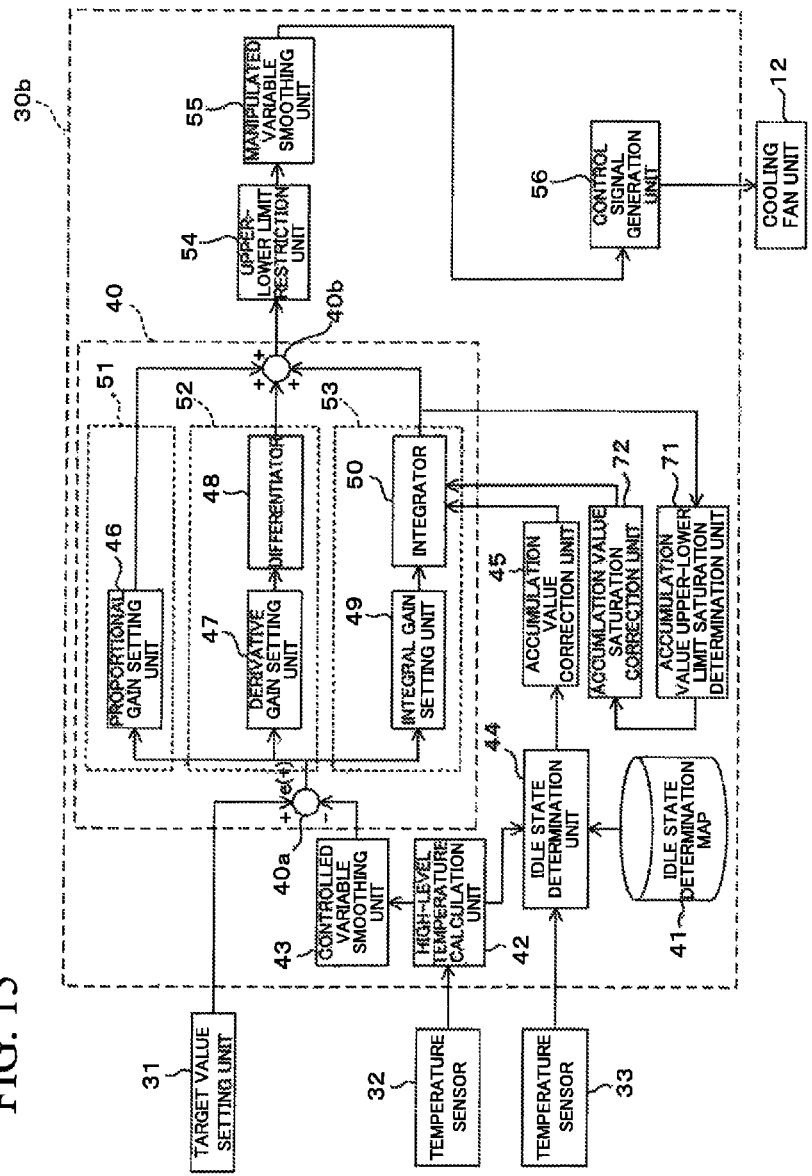
FIG. 15 is a functional block diagram describing a configuration of a control unit of a temperature management system according to a third embodiment.

FIG. 15 is a functional block diagram describing a configuration of a control unit of a temperature management system according to a third embodiment. This embodiment is different from the first embodiment in that an accumulation value upper-lower limit saturation determination unit and an accumulation value saturation correction unit are provided in the control unit. The rest of the configurations are basically the same as those of the first embodiment. For this reason, in FIG. 15, the same constituents as those in FIG. 5 will be denoted by the same reference numerals and detailed descriptions thereof will be omitted. In addition, this embodiment will also be described with reference to FIG. 1 and FIG. 2.

As illustrated in FIG. 15, in the temperature management system according to this embodiment, an accumulation value upper-lower limit saturation determination unit 71 and an accumulation value saturation correction unit 72 are provided in a control unit 30b. The accumulation value upper-lower limit saturation determination unit 71 determines whether or not the accumulation value of the integrator 50 falls within a predetermined range. The accumulation value saturation correction unit 72 corrects the accumulation value of the integrator 50 with a preset upper limit when the accumulation value upper-lower limit saturation determination unit 71 determines that the accumulation value is greater than the upper limit. The accumulation value saturation correction unit 72 corrects the accumulation value of the integrator 50 with a preset lower limit when the accumulation value upper-lower limit saturation determination unit 71 determines that the accumulation value is smaller than the lower limit.

Figure 16A:
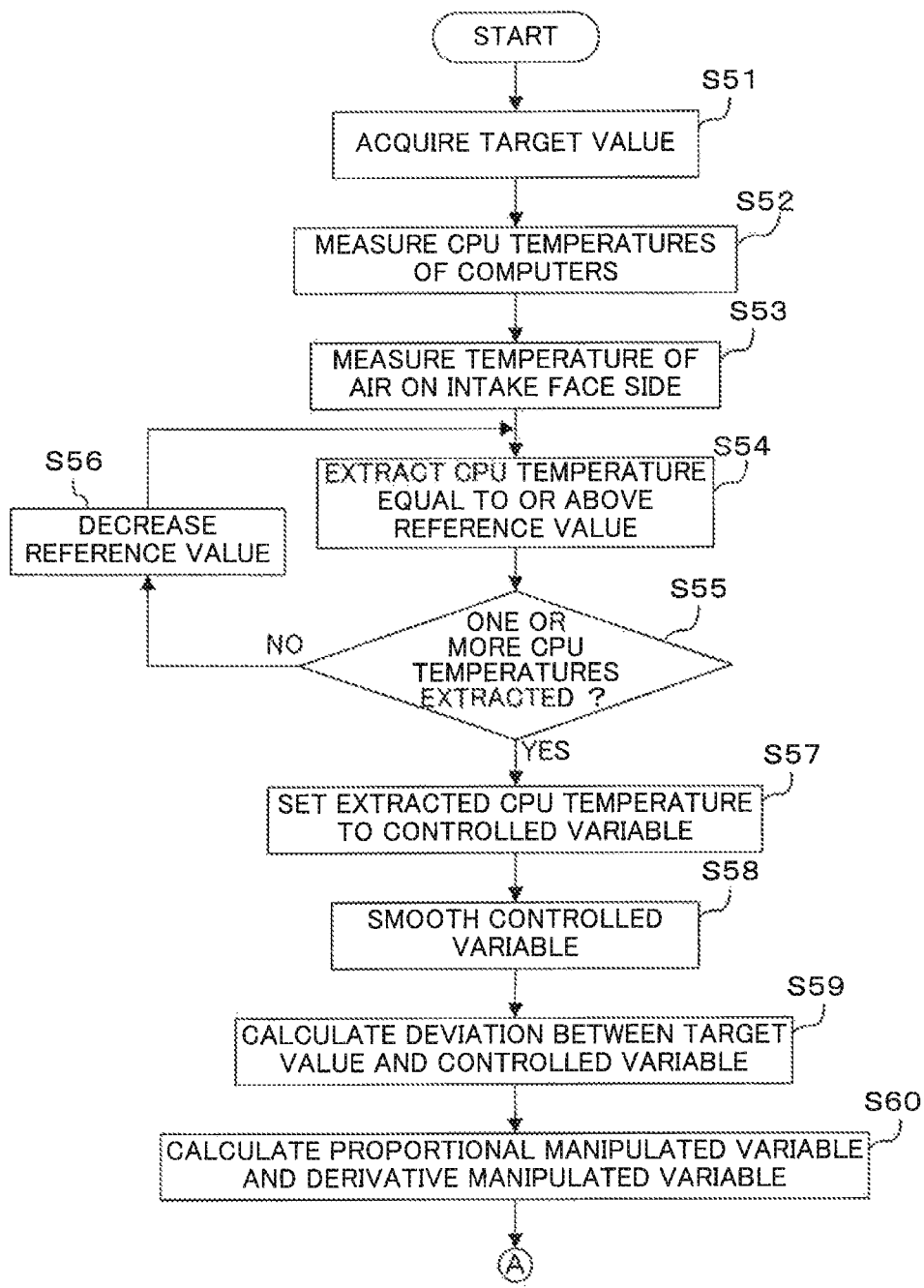
FIGS. 16A and 16B are flowcharts illustrating a temperature management method by the temperature management system according to the third embodiment.
Figure 16B:
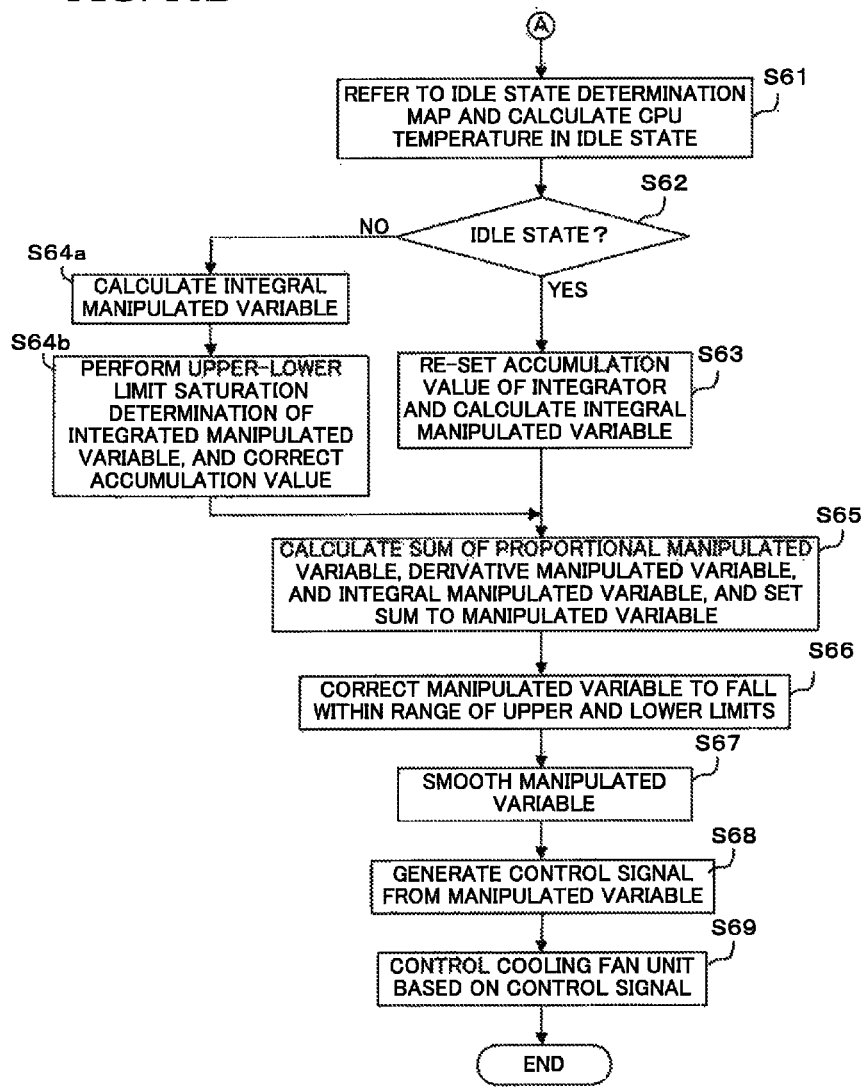

FIGS. 16A and 16B are flowcharts illustrating a temperature management method by the temperature management system according to this embodiment. Operations of the control unit 30b will be described further in detail with reference to the flowcharts. Here, it is assumed that the control unit 30b performs a sequence of the operations illustrated in FIGS. 16A and 16B for each rack 13 and at each given time interval (such as every second).

First, in step S51, the control unit 30b acquires the target value set to the target value setting unit 31.

Next, the process proceeds to step S52 where the control unit 30b acquires the CPU temperatures of the computers 14 through the temperature sensors 32. Meanwhile, in step S53, the control unit 30b acquires the temperature of the air on the intake face side of the rack 13 through the temperature sensor 33.

Next, the process proceeds to step S54 where the control unit 30b extracts a CPU temperature from the measurement values of the CPU temperatures of the computers 14 acquired through the temperature sensors 32, the CPU temperature being equal to or above the reference value θ.

Next, in step S55, the control unit 30b determines whether or not at least one CPU temperature was successfully extracted. The process proceeds to step S56 if no CPU temperature is extracted, i.e., if there is no CPU 14a with the CPU temperature exceeding the reference value θ in the targeted rack 13. Then, the control unit 30b decreases the reference value θ just by the amount φ calculated by the above-described formula (1). Thereafter, the process proceeds to step S54.

In this way, the control unit 30b repeats the step S54 to step S56 until at least one CPU temperature exceeding the reference value θ is extracted.

When at least one CPU temperature exceeding the reference value θ is extracted in step S54, the process proceeds to step S57 from step S55. In step S57, the control unit 30b sets the CPU temperature acquired in step S54 to the controlled variable y(s). When there are two or more CPU temperatures extracted in step S54, either the average value or the highest value thereof is set to the controlled variable y(s).

The above-described operations from step S54 to step S57 are executed by the high-level temperature 16 calculation unit 42.

Thereafter, the process proceeds to step S58 where the control unit 30b performs the smoothing in order to smooth the fluctuation in the controlled variable y(s). The smoothing is executed by the controlled variable smoothing unit 43.

Next, the process proceeds to step S59 where the control unit 30b calculates the deviation e(t) between the target value r(t) acquired from the target value setting unit 31 and the smoothed controlled 26 variable y(s) by the above-described formula (4). This calculation is performed by the calculator 40a.

Next, the process proceeds to step S60 where the control unit 30b calculates the proportional manipulated variable $u_P(t)$ depending on the deviation e(t) by the above-described formula (5). Moreover, the control unit 30b calculates the derivative manipulated variable $u_D(t)$ depending on the amount of change in the deviation e(t) by the above-described formula (6).

These calculations are performed by the proportional manipulated variable calculation module 51 and the derivative manipulated variable calculation module 52 of the manipulated variable calculation unit 40.

Next, the process proceeds to step S61 where the control unit 30b refers to the idle state determination map stored in the idle state determination map storage unit 41, and finds the CPU reference temperature $Ta_{base}$ in the idle state by using the temperature Tc of the air on the intake face side of the rack 13 and the reference temperature Ta of the CPU in the idle state.

Next, in step S62, the control unit 30b determines whether or not the computers 14 are in the idle state. Here, the computer 14 is determined to be in the idle state when the value of the CPU temperature (the controlled variable y(s)) transferred from the high-level temperature calculation unit 42 is smaller than the value $Ta_{base}+\beta$, i.e., when $Ta_{base}+\beta > y(s)$ holds true. In this embodiment, the value β is set to 5° C. as in the first embodiment.

The process proceeds to step S63 in the case of the determination as being in the idle state (in the case of YES) in step S62, or proceeds to step S64a from step S62 in the case of the determination as not being in the idle state (in the case of NO) therein.

In step S63, the accumulation value S(t) of the integrator 50 is re-set to the predetermined value γ. In this embodiment, γ is set equal to 0. Thereafter, the integral manipulated variable $u_I(t)$ is calculated by the above-described formula (11), and the process proceeds to step S65.

On the other hand, when the process proceeds to step S64a from step S62, the control unit 30b calculates the integral manipulated variable $u_I(t)$ by the above-described formula (11).

Then, the process proceeds to step S64b where the control unit 30b corrects the accumulation value S(t) of the integrator 50 by the following formula (18) or formula (19), as needed, such that the accumulation value S(t) of the integrator 50 satisfies $S_{min} \leq S(t) \leq S_{max}$.

[Formula 18]

$$S(t)=S_{max}(S(t)>S_{max}) \quad (18)$$

[Formula 19]

$$S(t)=S_{min}(S(t)<S_{min}) \quad (19)$$

Here, $S_{min}$ is the preset lower limit of the accumulation value and $S_{max}$ is the preset upper limit of the accumulation value. In this embodiment, the value $S_{max}$ was set to 100 (S=100) and the value $S_{min}$ was set to −100 ($S_{min}$=−100) based on a result of tuning.

Next, in step S65, the control unit 30b calculates the sum of the outputs from the proportional manipulated variable calculation module 51, the derivative manipulated variable calculation module 52, and the integral manipulated variable calculation module 53 by using the calculator 40b, and outputs the calculated sum as the manipulated variable u(t).

Next, in step S66, the control unit 30b corrects the manipulated variable u(t), as needed, such that the manipulated variable u(t) falls within the range of $u_{min} \leq u(t) \leq u_{max}$.

Next, the process proceeds to step S67 where the control unit 30b smoothes the manipulated variable u(t) with the manipulated variable smoothing unit 55.

Next, the process proceeds to step S68 where the control unit 30b generates the control signal for the cooling fan unit 12 from the manipulated variable u(t) by using the control signal generation unit 56.

Subsequently, the process proceeds to step S69 where the control unit 30b controls the number of revolutions of each cooling fan 12a in the cooling fan unit 12 on the basis of the control signal.

As described above, in this embodiment, the control unit 30b re-sets the accumulation value S(t) of the integrator 50 of the integral manipulated variable calculation module 53 to the predetermined value γ in the idle state. For this reason, the deviation is not excessively accumulated in the integrator 50 in the idle state, so that the control is properly conducted after the transition from the idle state to the operational state.

Moreover, in this embodiment, the accumulation value of the integrator 50 is corrected, as needed, at the time not in the idle state such that the accumulation value falls within the predetermined range. For this reason, even when the target value is set in such a range which the control does not follow according to the conventional method, the deviation is not excessively accumulated in the integrator 50 and the computer 14 is cooled stably and efficiently.

Figure 17A:
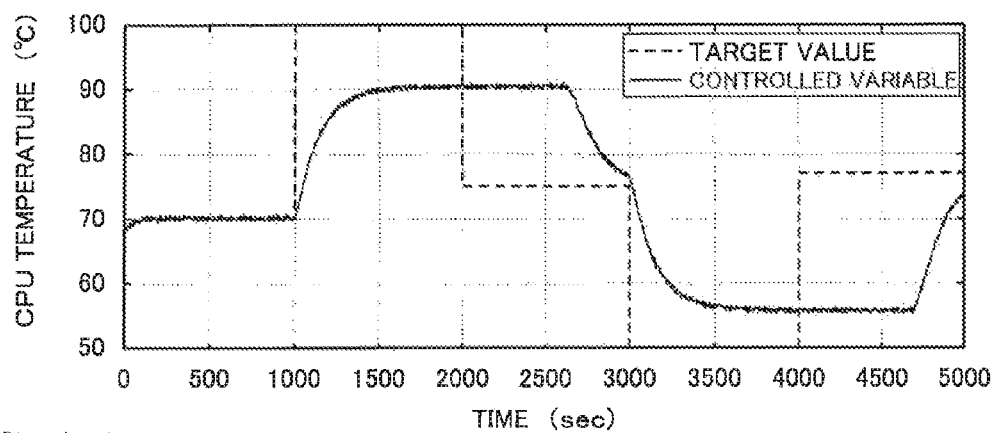
FIGS. 17A and 17B are graphs illustrating an example of temperature management by the temperature management system according to the third embodiment in comparison with the conventional method.
Figure 17B:
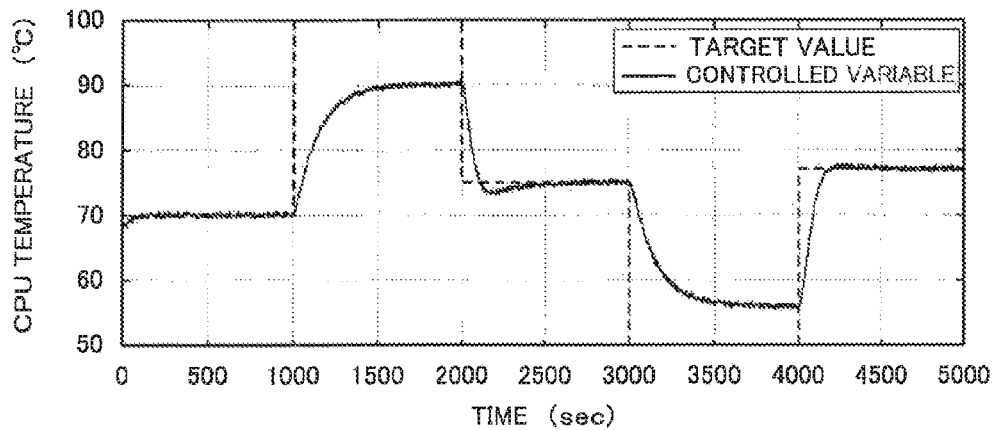

FIGS. 17A and 17B are graphs illustrating an example of temperature management by the temperature management system according to this embodiment in comparison with the conventional method. In each of FIGS. 17A and 17B, a dashed line indicates the target value and a solid line indicates the controlled variable. Here, in each of a period from 1000 second later to 2000 seconds later and a period from 3000 seconds later to 4000 second later, the target value is set to such a value which the controlled variable does not follow.

In the conventional method, when the target value is set to such a value which the controlled variable does not follow, there occurs a situation where the control does not function for some time even after the target value falls within a followable range as illustrated in FIG. 17A.

On the other hand, in the temperature management system according to this embodiment, even when the target value is set to such a value which the controlled variable does not follow, the control quickly functions once the target value falls within a followable range as illustrated in FIG. 17B.

Other Embodiments

Figure 18:
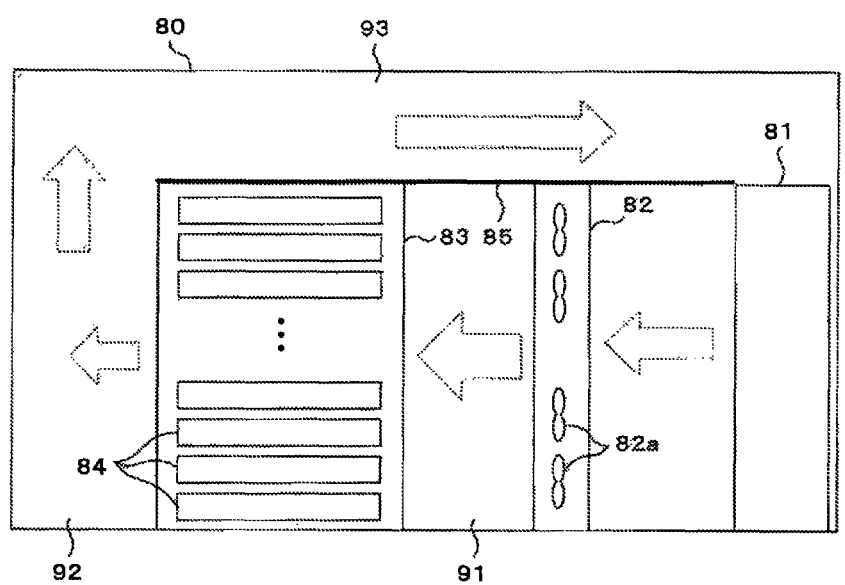
FIG. 18 is a view illustrating an example of a data center applying a mode in which no outside air is introduced into a room.

Each of the first to third embodiments describes the temperature management system for the modular data center, which is designed to cool the computers by introducing the outside air into the room. However, the disclosed technique may also be used for temperature management of a data center of a mode not introducing the outside air into the room. FIG. 18 is a view illustrating an example of such a data center.

A plurality of racks 83, an air conditioner (a package air conditioner) 81, and a cooling fan unit 82 are disposed inside a computer room 80. A plurality of computers 84 are housed in each rack 83. Meanwhile, the cooling fan unit 82 includes a plurality of cooling fans 82a.

A section between the cooling fan unit 82 and intake faces of the racks 83 is a cold aisle 91, and a space on an exhaust face side of the racks 83 is a hot aisle 92. Meanwhile, a partition plate 85 is disposed above the cooling fan unit 82 and the racks 83. A space above the partition plate 85 is defined as a warm air flow passage 93 configured to bring the air discharged to the hot aisle 92 back to the air conditioner 81.

The low-temperature air blown out of an air outlet of the air conditioner 81 is sent to the cold aisle 91 by the cooling fan unit 82, and is introduced from an intake face of each rack 83 into the rack 83. The air introduced into the rack 83 cools electronic components such as CPUs while passing through the computers 84 and the temperature of the air is increased. Then, the air is discharged from an exhaust face of each rack 83 to the hot aisle 92.

The air discharged to the hot aisle 92 passes through the warm air flow passage 93 and moves to an intake port of the air conditioner 81. Then, the temperature of the air is adjusted by the air conditioner 81, and the air is blown out of the air outlet again.

In the above-described data center, the adoption of any of the temperature management systems described in the first to third embodiments, for example, enables the proper cooling depending on the temperatures of the CPUs while suppressing reduction in substantive operating rate of the computers 84.

Although the above-described embodiments explain the temperature management systems configured to manage the temperatures of the computers, the disclosed technique is also applicable to cooling of electronic devices other than the computers.

Meanwhile, the above-described embodiments explain the case of defining the plurality of computers 14 housed in the same rack 13 as one group, and controlling the cooling fan unit 12 corresponding to each group (each rack 13). Instead, a plurality of computers 14 disposed on an upper side of each rack 13 may be defined as one group and a plurality of computers 14 disposed on a lower side thereof may be defined as another group, for example, and a cooling fan 12a on an upper side of each cooling fan unit 12 and a cooling fan 12a on a lower side thereof may be controlled individually.

All examples and conditional language recited herein are intended for the pedagogical purposes of aiding the reader in understanding the invention and the concepts contributed by the inventor to further the art, and are not to be construed as limitations to such specifically recited examples and conditions, nor does the organization of such examples in the specification relate to a showing of the superiority and inferiority of the invention. Although one or more embodiments of the present invention have been described in detail, it should be understood that the various changes, substitutions, and alterations could be made hereto without departing from the spirit and scope of the invention.

What is claimed is:

1. A temperature management system comprising:
   a plurality of electronic devices each changing an amount of heat generation depending on its operational state;
   temperature detection units configured to individually detect temperatures of the plurality of electronic devices;
   a cooling device configured to cool the plurality of electronic devices; and
   a control unit configured to control the cooling device depending on outputs from the temperature detection units,
   wherein the control unit includes:
   an idle state determination unit configured to determine whether or not the electronic devices are in an idle state;
   a manipulated variable calculation unit provided with an integrator and configured to calculate a manipulated variable by using a difference between a target value and a controlled variable; and
   an accumulation value correction unit configured to correct an accumulation value of the integrator with a predetermined value when the idle state determination unit determines that the electronic devices are in the idle state.

2. The temperature management system according to claim 1, wherein the control unit subjects the cooling device to PID (proportional-integral-derivative) control or PI (proportional-integral) control.

3. The temperature management system according to claim 1, wherein the control unit further includes:
   a high-level temperature calculation unit configured to extract a temperature equal to or above a reference value from the temperatures detected by the temperature detection units, and to set the extracted temperature to the controlled variable;
   a controlled variable smoothing unit configured to smooth the controlled variable outputted from the high-level temperature calculation unit; and a control signal generation unit configured to generate a control signal to control the cooling device based on the manipulated variable outputted from the manipulated variable calculation unit.

4. The temperature management system according to claim 3, wherein the control unit further includes an upper-lower limit restriction unit disposed between the manipulated variable calculation unit and the control signal generation unit, and configured to restrict an upper limit and a lower limit of the manipulated variable outputted from the manipulated variable calculation unit.

5. The temperature management system according to claim 4, wherein the control unit further includes a manipulated variable smoothing unit disposed between the upper-lower limit restriction unit and the control signal generation unit, and configured to smooth the manipulated variable.

6. The temperature management system according to claim 3, wherein, when no temperature equal to or above the reference value is extracted, the control unit decreases a level of the reference value until at least one temperature equal to or above the reference value is extracted.

7. The temperature management system according to claim 3, wherein the control unit divides the plurality of electronic devices into a plurality of groups, extracts the temperature equal to above the reference value for each of the groups, and controls the cooling device for each of the groups.

8. The temperature management system according to claim 1, wherein the control unit includes an accumulation value saturation correction unit configured to restrict an upper limit and a lower limit of the accumulation value of the integrator when the idle state determination unit determines that the electronic devices are not in the idle state.

9. The temperature management system according to claim 1, the temperature management system further comprising:
a temperature sensor configured to detect a temperature of air outside the electronic devices,
wherein the idle state determination unit determines whether or not the electronic devices are in the idle state based on the temperatures detected by the temperature detection units and the temperature of the air detected by the temperature sensor.

10. The temperature management system according to claim 1, the temperature management system further comprising:
power consumption detection units configured to detect values of power consumption of the electronic devices,
wherein the idle state determination unit determines whether or not the electronic devices are in the idle state based on the temperatures of the electronic devices detected by the temperature detection units and the values of power consumption detected by the power consumption detection units.

11. The temperature management system according to claim 1, wherein the cooling device is a cooling fan unit including a plurality of cooling fans.

12. The temperature management system according to claim 1, wherein the electronic devices are computers.

13. The temperature management system according to claim 12, wherein the computers are housed in a rack.

14. The temperature management system according to claim 13, wherein outside air is introduced into a room where the rack is disposed.

* * * * *